(12) United States Patent
Nakagawa et al.

(10) Patent No.: US 12,342,467 B2
(45) Date of Patent: Jun. 24, 2025

(54) MICROSTRUCTURE-TRANSFER APPARATUS, STAMP HEAD UNIT, STAMP COMPONENT FOR TRANSFERRING MICROSTRUCTURE, AND METHOD FOR TRANSFERRING MICROSTRUCTURE-INTEGRATED COMPONENT

(71) Applicant: SHIN-ETSU CHEMICAL CO., LTD., Tokyo (JP)

(72) Inventors: Hideo Nakagawa, Omihachiman (JP); Yoshinori Ogawa, Kamakura (JP); Nobuaki Matsumoto, Takasaki (JP); Shuhei Ueda, Joetsu (JP); Keiji Ohori, Saitama (JP); Kohei Otake, Yokohama (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 720 days.

(21) Appl. No.: 17/427,437

(22) PCT Filed: Dec. 10, 2019

(86) PCT No.: PCT/JP2019/048225
§ 371 (c)(1),
(2) Date: Jul. 30, 2021

(87) PCT Pub. No.: WO2020/166184
PCT Pub. Date: Aug. 20, 2020

(65) Prior Publication Data
US 2022/0124949 A1      Apr. 21, 2022

(30) Foreign Application Priority Data

Feb. 12, 2019 (JP) ................. 2019-022527

(51) Int. Cl.
*B25B 11/00* (2006.01)
*H05K 13/04* (2006.01)
*H10H 20/01* (2025.01)

(52) U.S. Cl.
CPC ....... *H05K 13/0452* (2013.01); *H10H 20/018* (2025.01)

(58) Field of Classification Search
CPC ......... B25B 11/00; B24B 53/07; B24B 37/04; H05K 13/04
See application file for complete search history.

(56) References Cited

U.S. PATENT DOCUMENTS 7,592,104 B2 * 9/2009 Tanabe ..................... G03F 1/50
                                                              430/5
7,927,976 B2   4/2011 Menard
(Continued)

FOREIGN PATENT DOCUMENTS

CN     101604641 A     12/2009
CN     101715287 A     5/2010
(Continued)

OTHER PUBLICATIONS

Mar. 29, 2022 Office Action issued in Japanese Patent Application No. 2019-022527.
(Continued)

*Primary Examiner* — Lee D Wilson
(74) *Attorney, Agent, or Firm* — Oliff PLC

(57) ABSTRACT

A stamp head unit including: a stamp component including at least a silicone-based rubber film on a quartz glass substrate; a stamp-component-holding component including a surface having a hole for vacuum suction of a surface of the quartz glass substrate of the stamp component; and a tubular component having an evacuation suction hole connected to communicate with the hole for vacuum suction so
(Continued)

as to maintain a vacuum, and being coupled and fixed with the stamp-component-holding component. This provides: a stamp component that can be fixed stably by a simple and convenient vacuum chuck system; a stamp head unit with which the stamp component can be replaced in a short time; and a microstructure-transfer apparatus provided with the stamp component and the stamp head unit.

42 Claims, 14 Drawing Sheets

(56) References Cited

U.S. PATENT DOCUMENTS

| | | | |
|---|---|---|---|
| 7,943,941 | B2 | 5/2011 | Shimizu et al. |
| 10,600,823 | B2 | 3/2020 | Hughes et al. |
| 2012/0156563 | A1 | 6/2012 | Kobayashi et al. |
| 2014/0130691 | A1 | 5/2014 | Yang et al. |
| 2014/0273752 | A1* | 9/2014 | Bajaj ................ B24B 49/18 451/6 |
| 2014/0367705 | A1 | 12/2014 | Bibl et al. |
| 2017/0345692 | A1 | 11/2017 | Liu et al. |
| 2018/0122683 | A1 | 5/2018 | Hsu et al. |
| 2022/0124949 | A1* | 4/2022 | Nakagawa ......... H05K 13/0452 |

FOREIGN PATENT DOCUMENTS

| | | |
|---|---|---|
| CN | 102483977 A | 5/2012 |
| CN | 104465482 A | 3/2015 |
| CN | 104882403 A | 9/2015 |
| CN | 106057723 A | 10/2016 |
| CN | 106229287 A | 12/2016 |
| CN | 106941090 A | 7/2017 |
| CN | 207116403 U | 3/2018 |
| JP | 2011-061011 A | 3/2011 |
| JP | 2013-237583 A | 11/2013 |
| JP | 2016-522585 A | 7/2016 |
| JP | 2018-142713 A | 9/2018 |
| KR | 10-2008-0046986 A | 5/2008 |
| KR | 20-2009-0001646 U | 2/2009 |
| KR | 10-2011-0052654 A | 5/2011 |
| KR | 10-2014-0061912 A | 5/2014 |
| KR | 10-2015-0002404 A | 1/2015 |
| KR | 10-2015-0141361 A | 12/2015 |
| KR | 10-1788564 B1 | 10/2017 |
| TW | 201834193 A | 9/2018 |
| TW | M573076 U | 1/2019 |
| WO | 2008088069 A1 | 7/2008 |

OTHER PUBLICATIONS

Nov. 30, 2023 Office Action issued in Chinese Patent Application No. 201980091218.3.
Aug. 26, 2021 English translation of Preliminary Report on Patentability issued in International Application No. PCT/JP2019/048225.
"Matthew A. Meitl, et al., "Transfer Printing By Kinetic Control of Adhesion to an Elastomeric Stamp", Nature Materials, vol. 5, pp. 33-Jan. 2006."
Nov. 20, 2020 Office Action and Search Report issued in Taiwanese Patent Application No. 108146867.
Jan. 21, 2020 Search Report issued in International Patent Application No. PCT/JP2019/048225.
Sep. 27, 2022 Search Report issued in European Patent Application No. 19914902.2.
May 13, 2024 Search Report issued in Chinese Application No. 2019800912183.
May 13, 2024 Office Action issued in Chinese Application No. 2019800912183.
Aug. 8, 2024 Office Action issued in Korean Application No. 10-2021-7025080.
Feb. 18, 2025 Office Action issued in Korean Application No. 10-2021-7025080.

* cited by examiner

[FIG. 1]
(a)
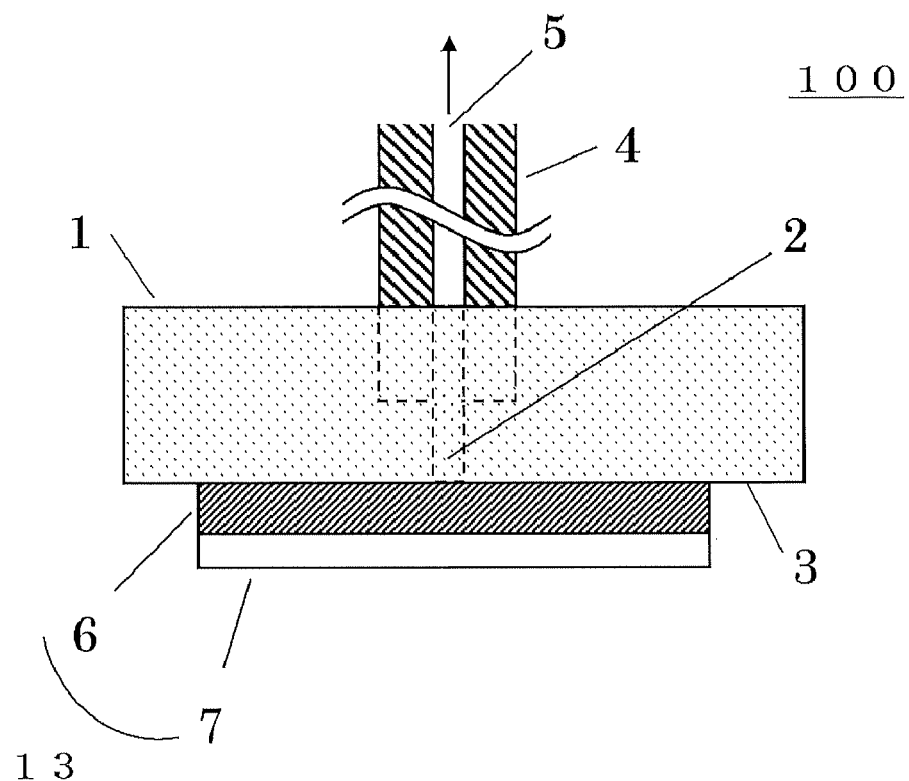
(b)
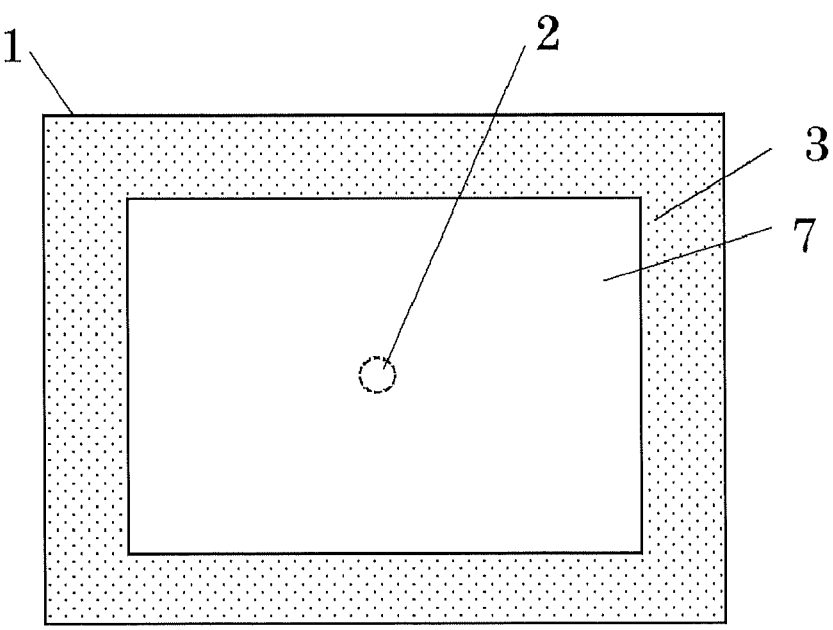

[FIG. 2]
(a)
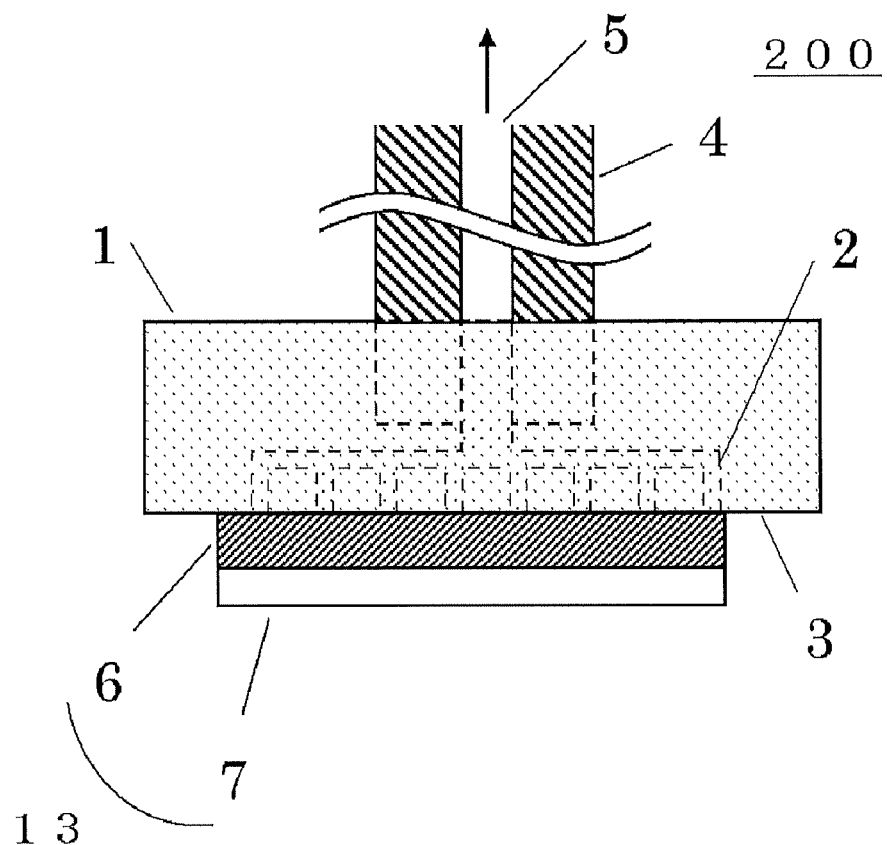
(b)
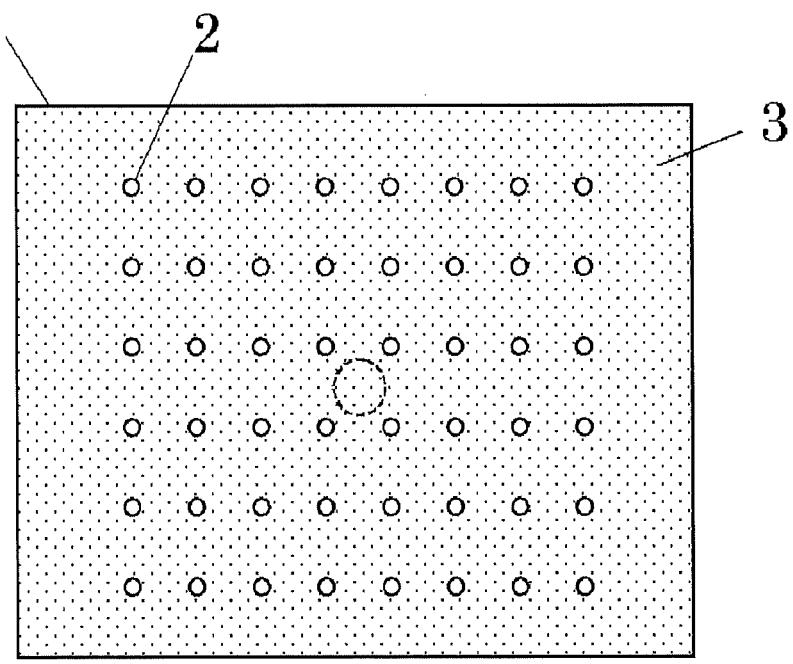

[FIG. 3]
(a)
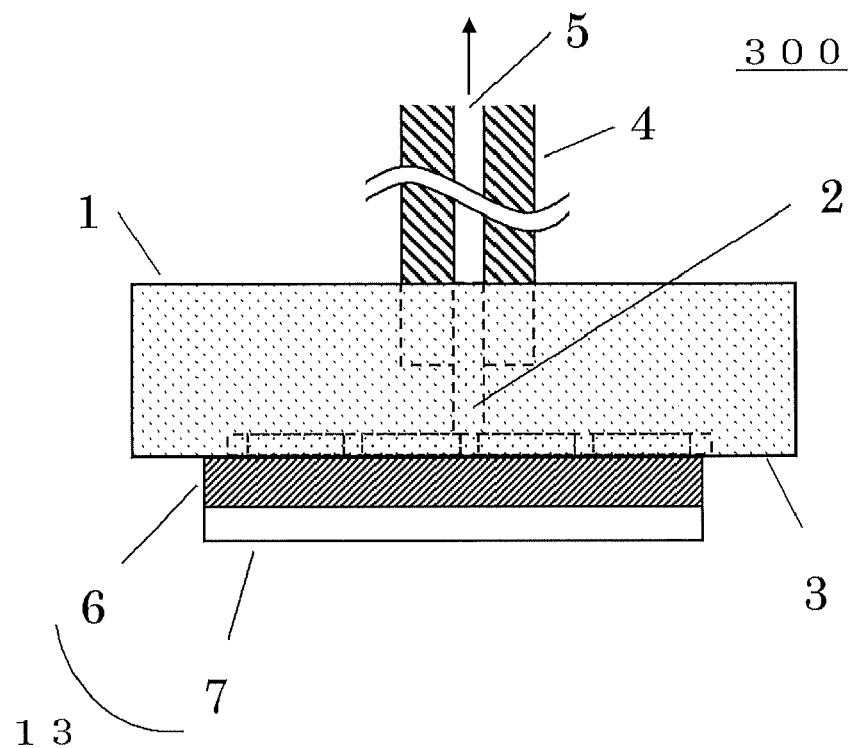
(b)
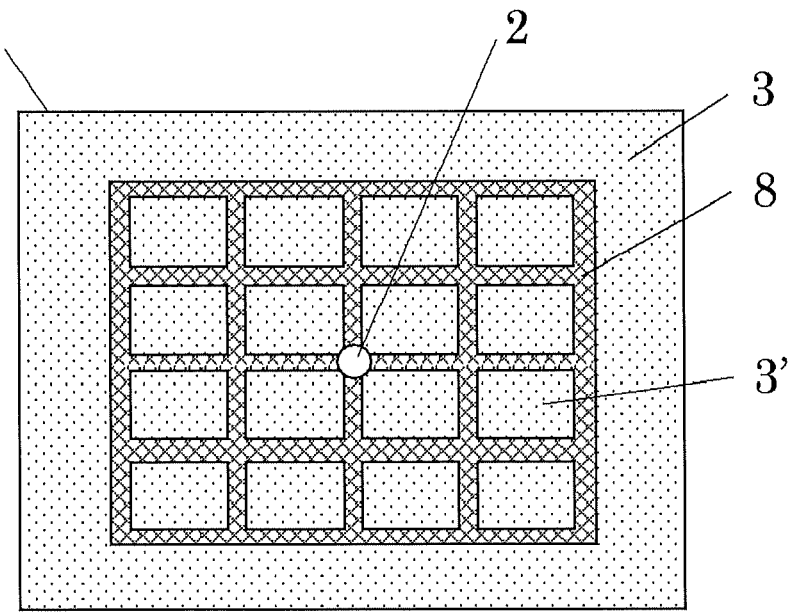

[FIG. 4]
(a)
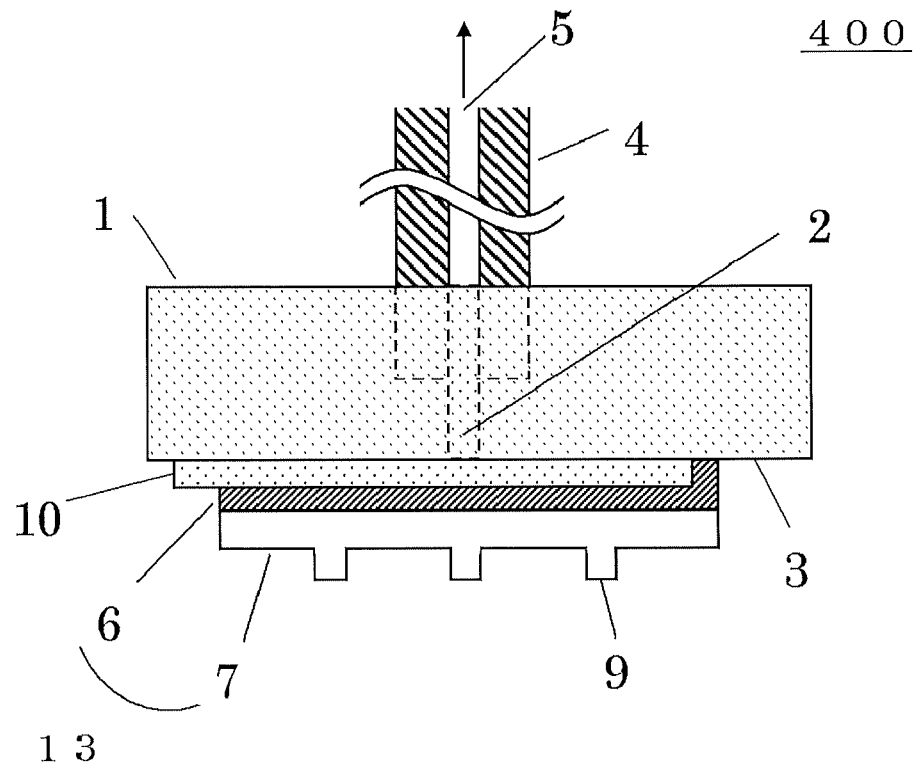
(b)
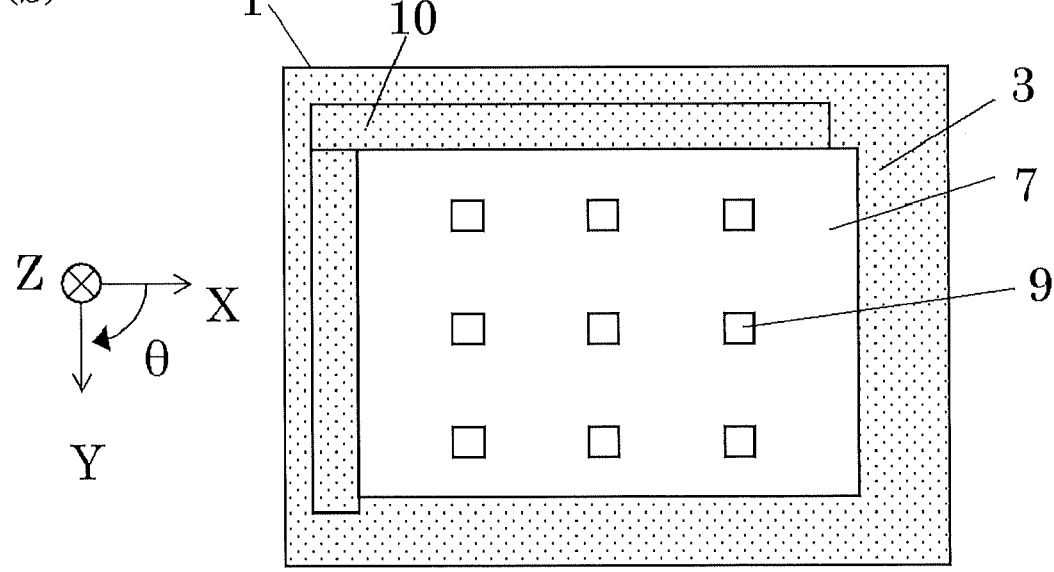

[FIG. 5]
(a)
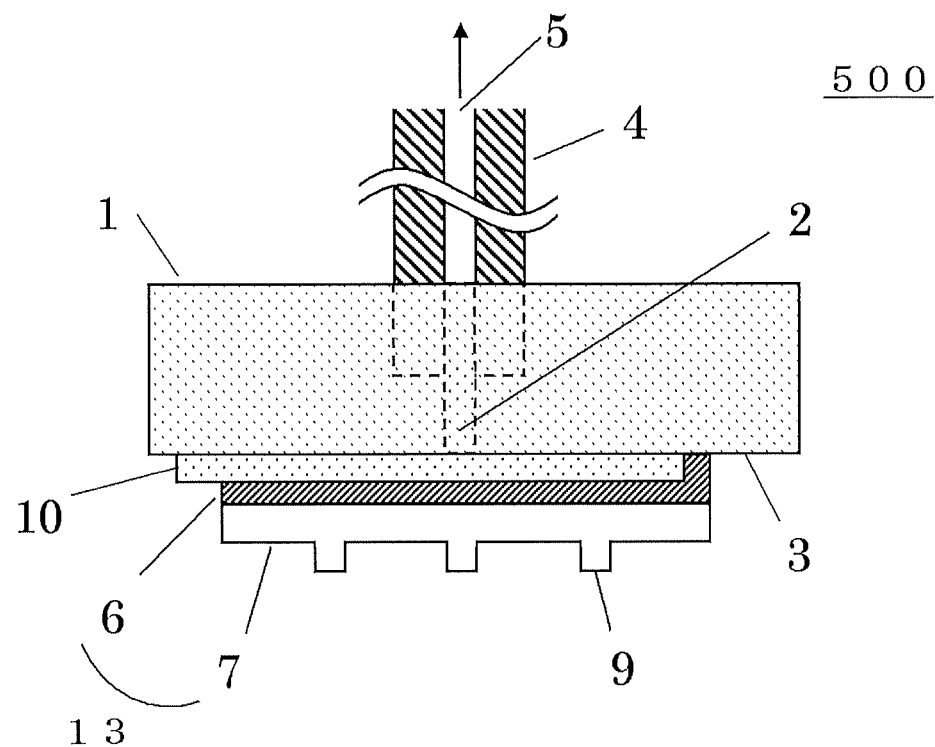
(b)
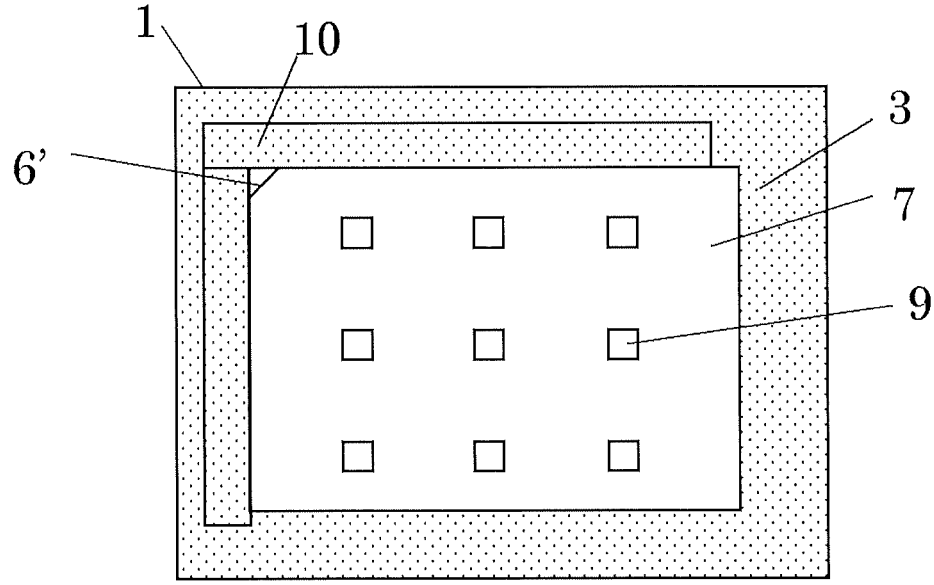

[FIG. 6]
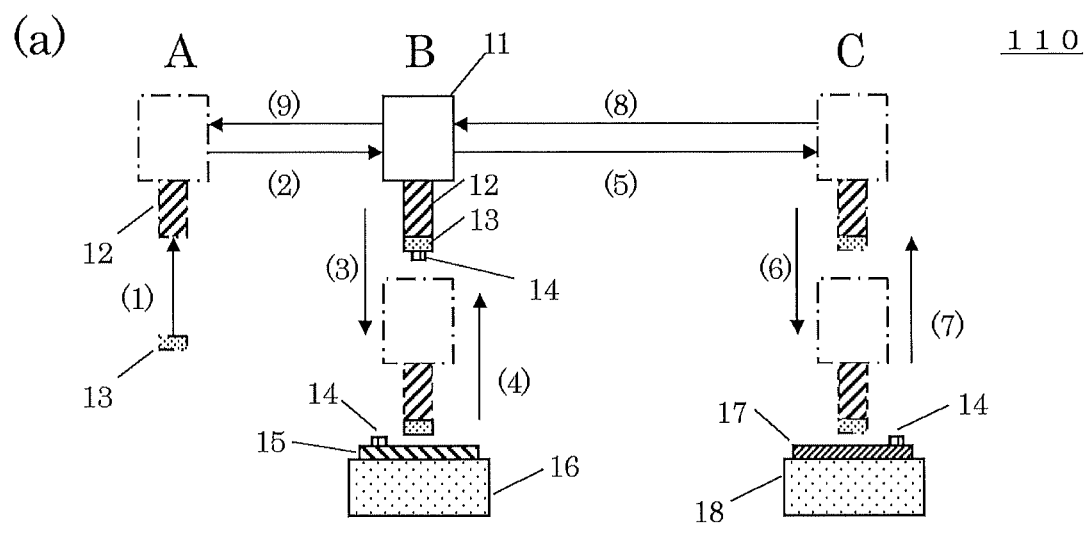
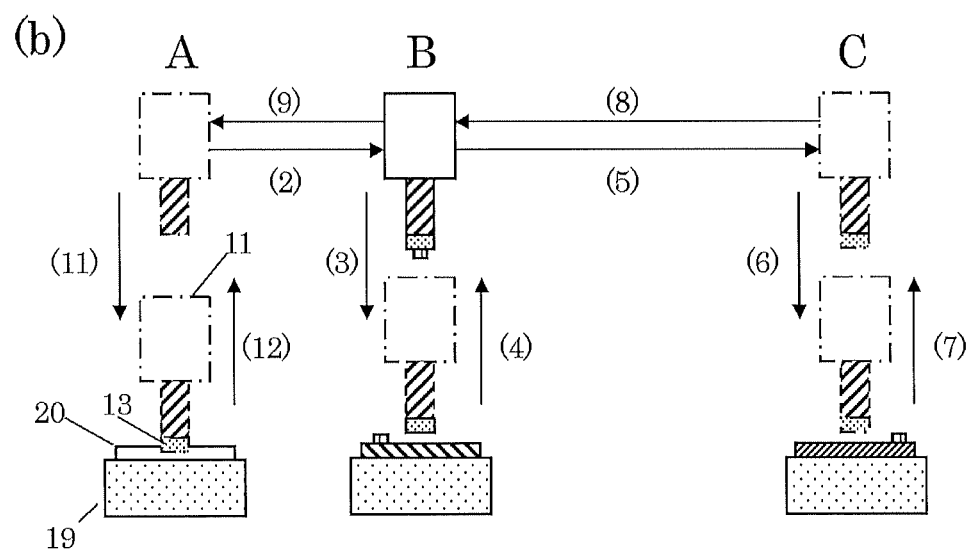

[FIG. 7]
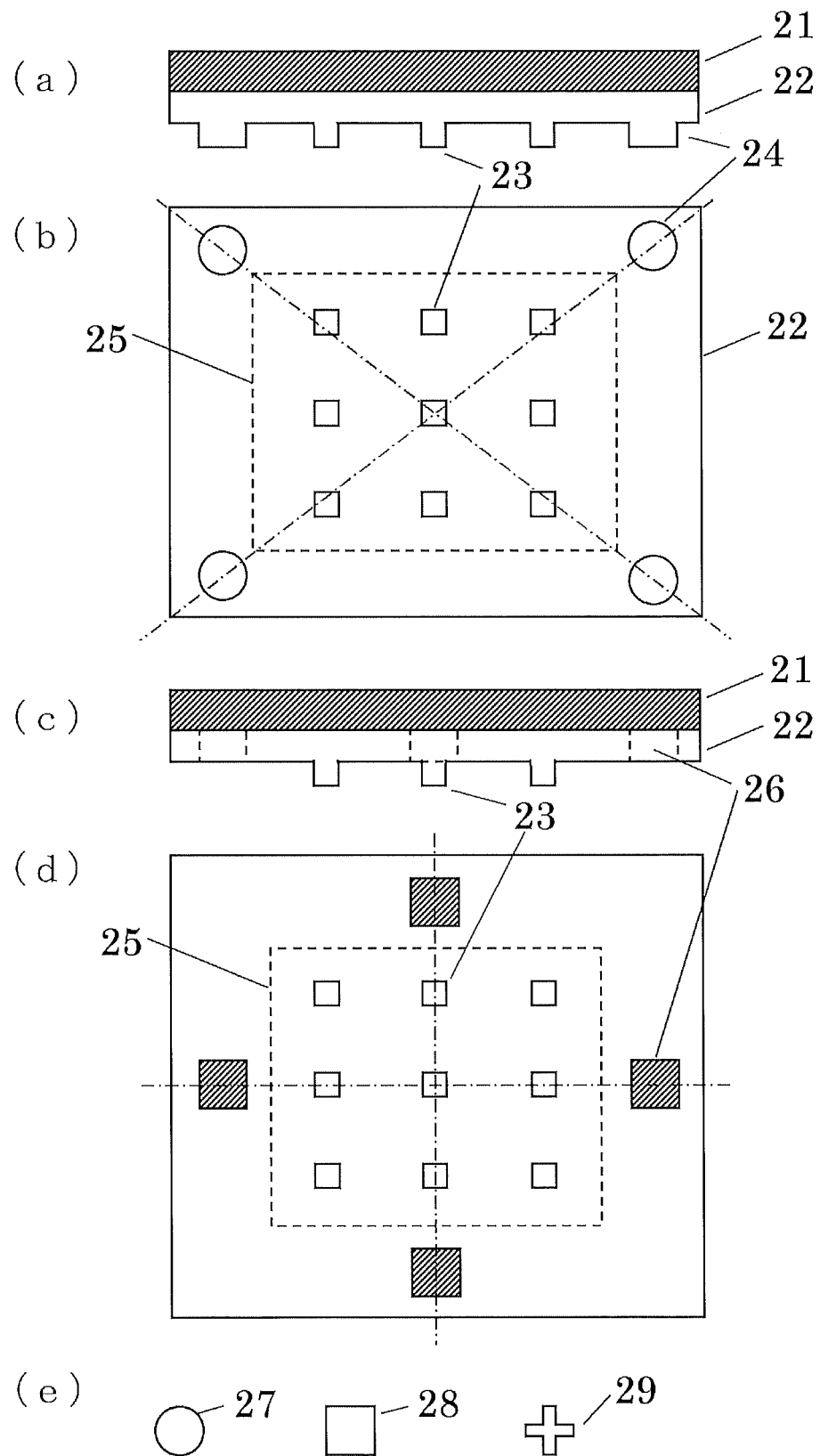

[FIG. 8]
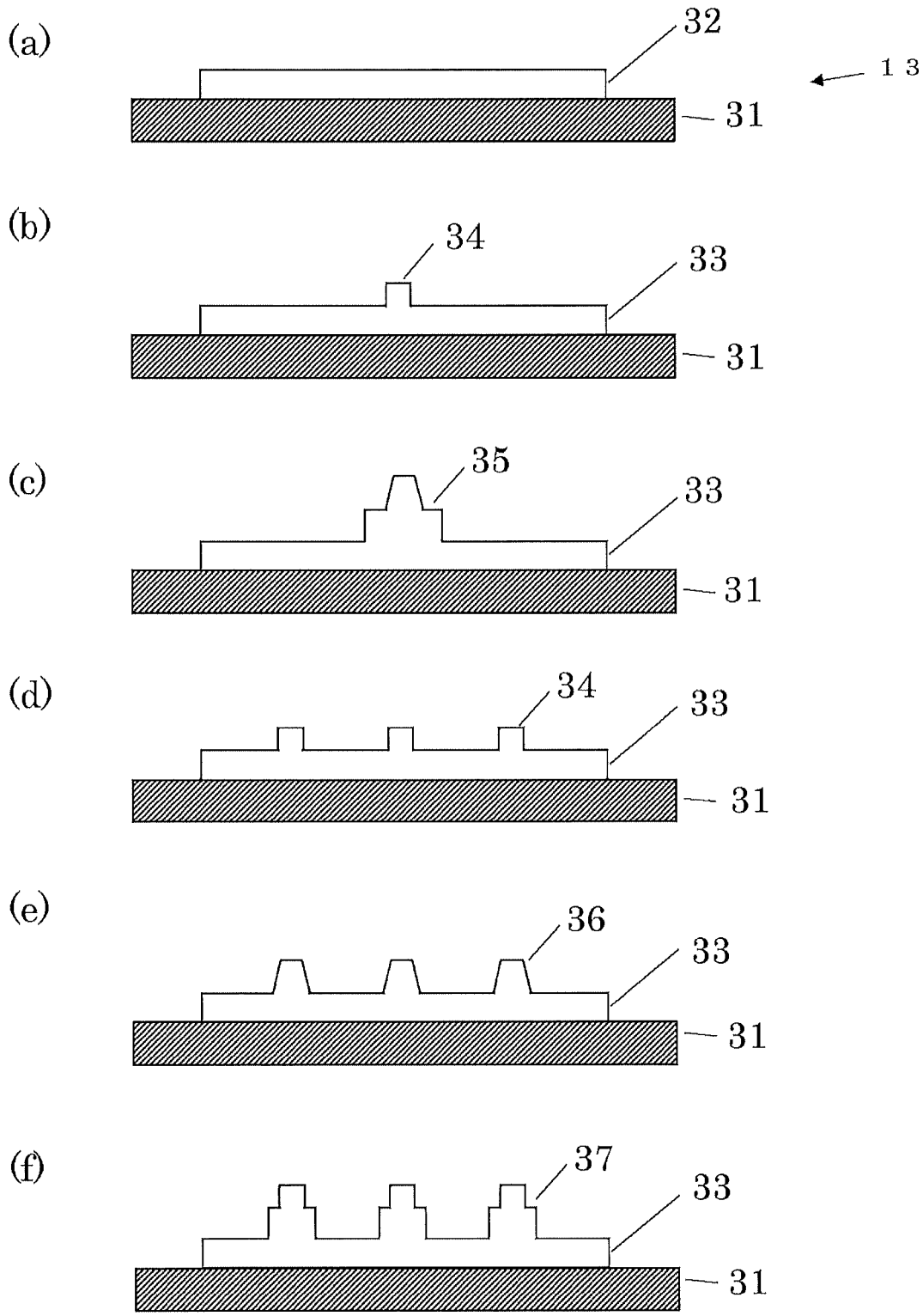

[FIG. 9]
(a)
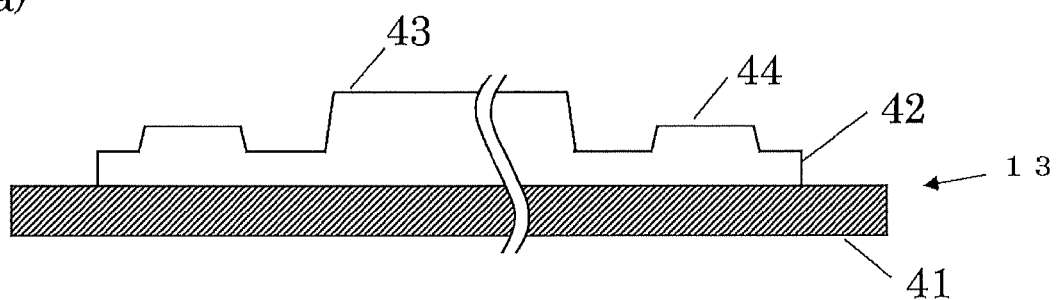
(b)
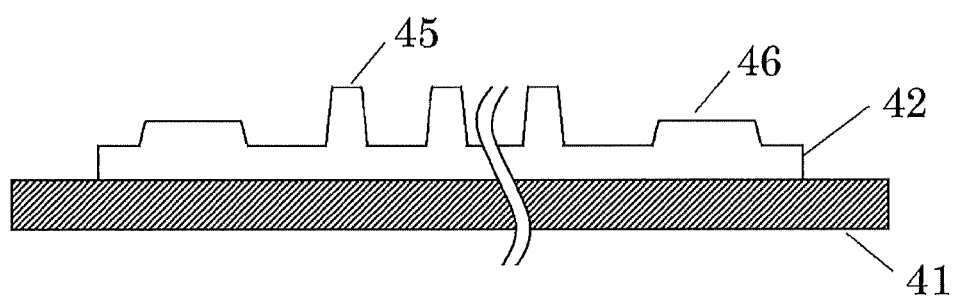

[FIG. 10]
(a)
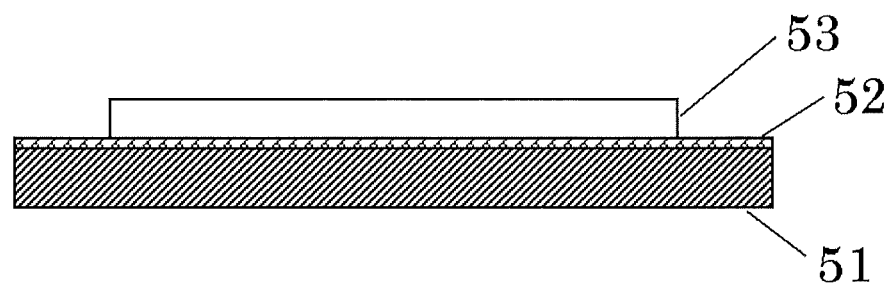
(b)
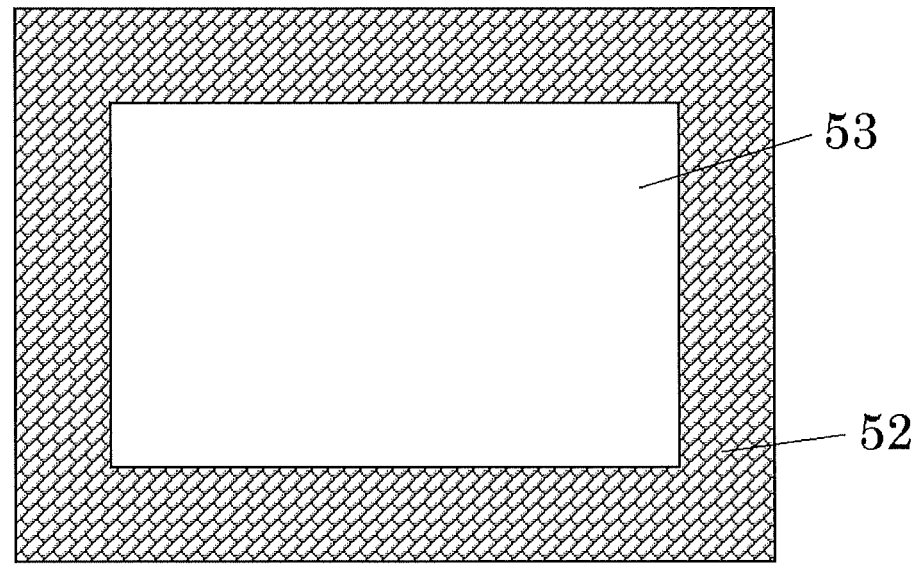

[FIG. 11]
(a)
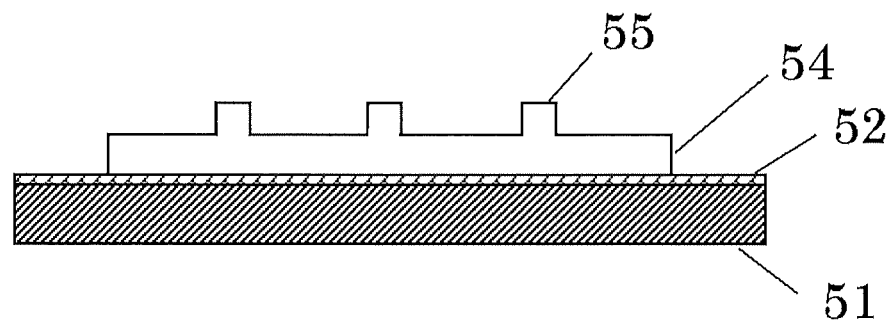
(b)
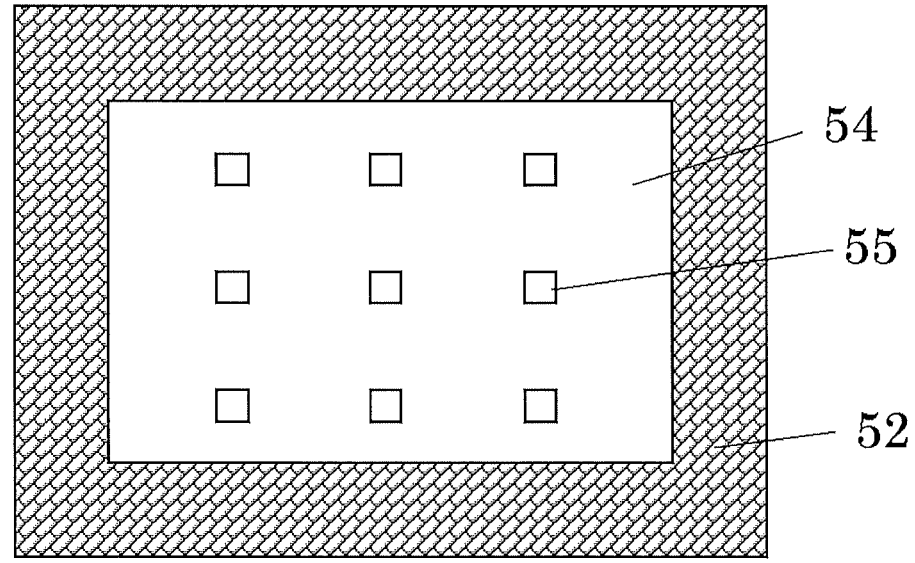

[FIG. 12]
(a)
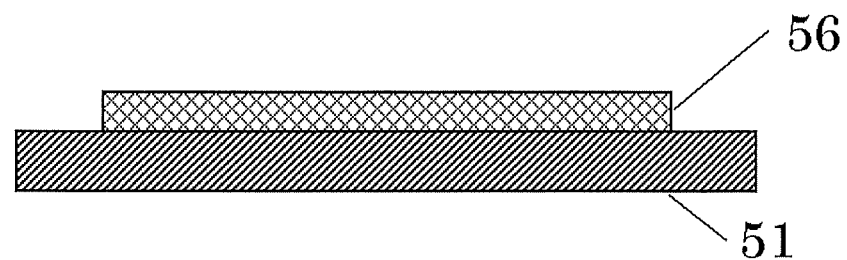
(b)
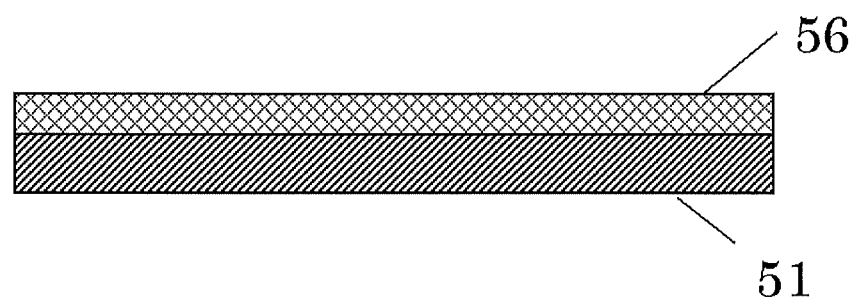
(c)
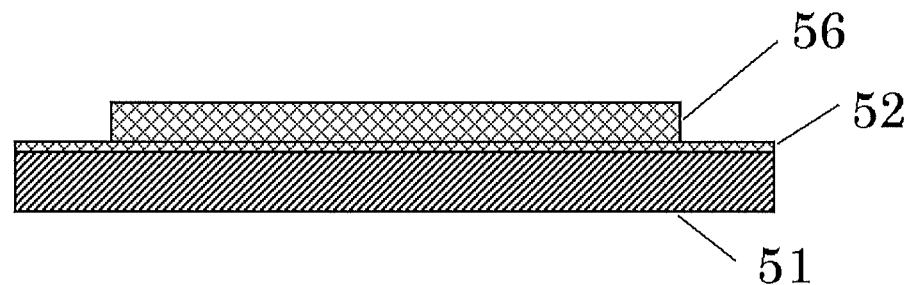

[FIG. 13]
(a)
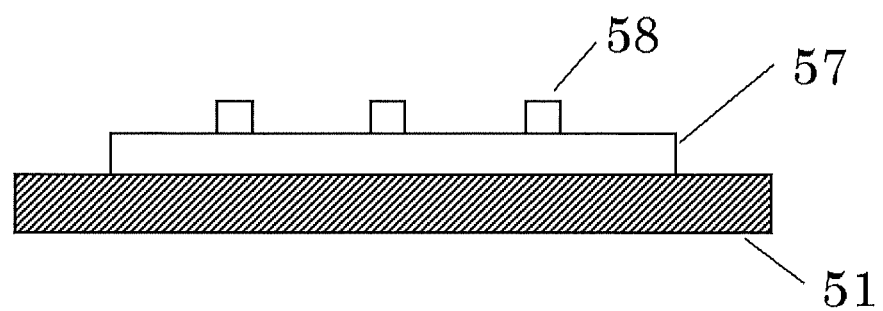
(b)
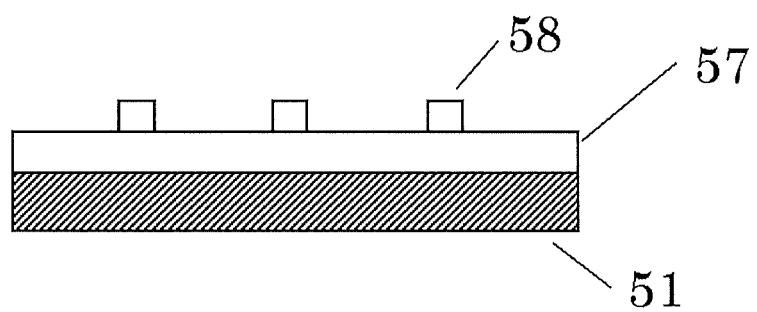
(c)
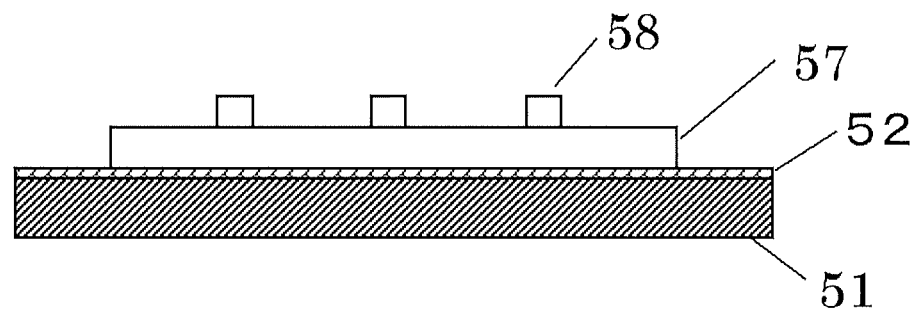

[FIG. 14]
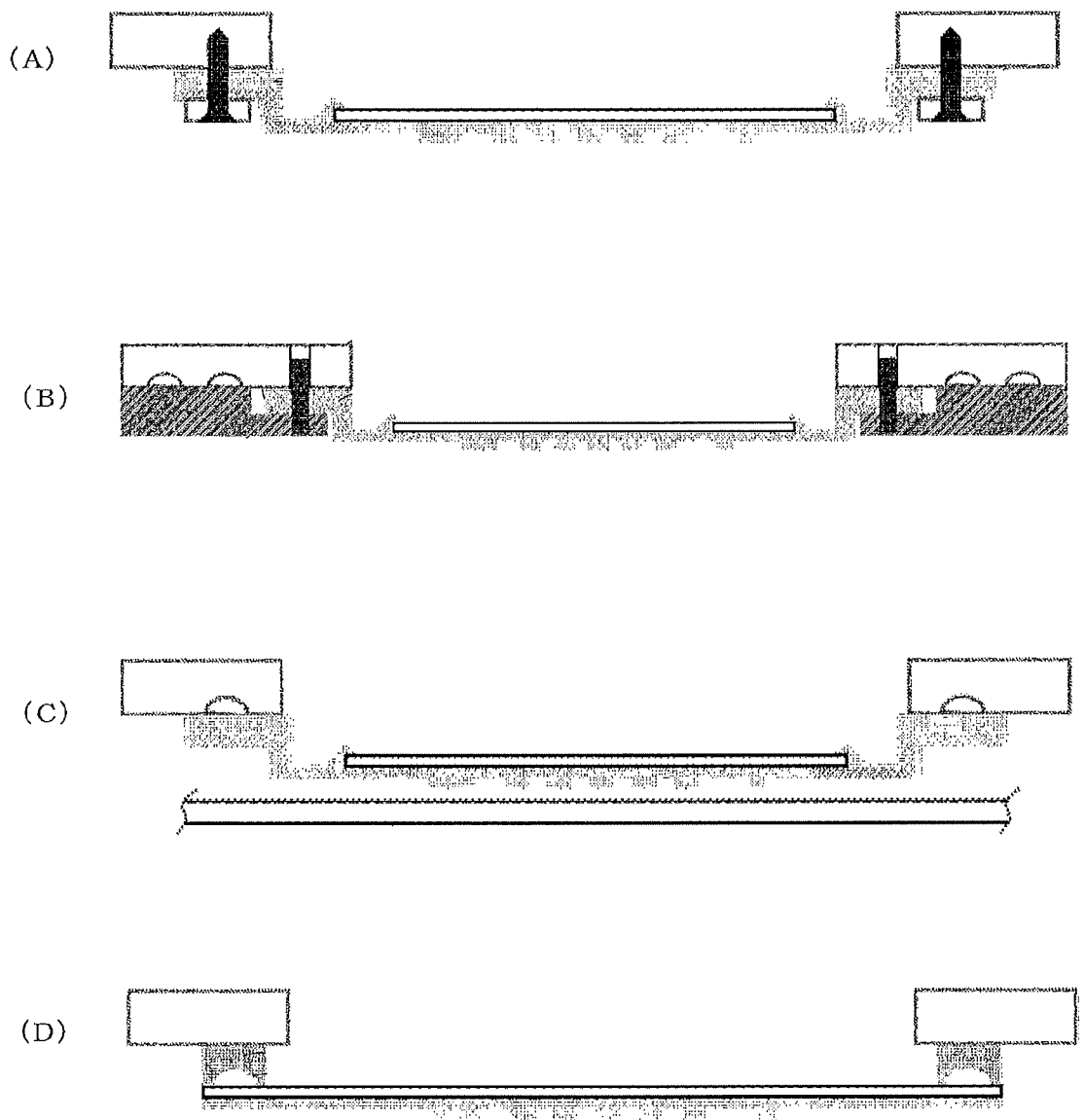

MICROSTRUCTURE-TRANSFER APPARATUS, STAMP HEAD UNIT, STAMP COMPONENT FOR TRANSFERRING MICROSTRUCTURE, AND METHOD FOR TRANSFERRING MICROSTRUCTURE-INTEGRATED COMPONENT

TECHNICAL FIELD

The present invention relates to: a microstructure-transfer apparatus for transferring a microstructure such as a semiconductor device formed or provided on a substrate to a different substrate; a stamp head unit used in this apparatus; a stamp component for transferring a microstructure; and a method for transferring a microstructure-integrated component.

BACKGROUND ART

In recent years, with miniaturization of semiconductor devices, technology for transferring microstructures by using a stamp is drawing attention as a means for constructing electrical and electronic-applied products that use semiconductor devices (Non Patent Document 1). In particular, using this technology, one or a plurality of, and furthermore, a large quantity of tens of thousands of mini-LEDs (LEDs with a short side of 100 μm or more to several hundred μm) or micro-LEDs (with a short side of 100 μm or less, and furthermore, 50 μm or less) are transferred at once. The development of technology for manufacturing displays for signage, TV, medical use, on-board use, Pad, smartphone, Smartwatch, etc. and LED displays for AR/VR, etc. in this manner is becoming active.

As conventional technology, Patent Document 1 reports that a large quantity of elements can be transported from a donor substrate to a receiving substrate by using a flat plate of PDMS (polydimethylsiloxane) rubber.

Patent Document 2 shows a structure of a composite stamp which uses PDMS and has a convex-shaped projection and a method for fixing the composite stamp to a stamp head. (A), (B), (C), and (D) of FIG. 14 each shows (A), (B), (C), and (D) of FIG. 2 in Patent Document 2, which is a conventional technology.

The composite stamps of the conventional technology shown in FIG. 14(A) to FIG. 14(C) have an extremely complex structure fully using a stamp, a support layer, a reinforcement layer that uses a fiber, a reinforcement ring, and so on. The methods for fixing these stamps are all methods of fixing the periphery mechanically or by using a vacuum. Therefore, it is clear that replacement operation including position adjustment takes time, and this is a major problem in mass production.

The stamp of the conventional technology shown in FIG. 14(D) has a structure in which a quartz glass support provided with a stamp material having a convex-shaped projection is fixed by vacuum suction. This structure is simpler and more convenient than the instances in the above-described FIG. 14(A) to (C). However, since the vacuum suction portion is constituted by a ring-shaped elastomer, deformation occurs when pressing the donor substrate and the receiving substrate in actual mass production where a transfer motion is performed repeatedly, so that a cause of positional displacement occurs. In some cases, there is also a possibility of the vacuum chuck coming off.

As described, the degradation of durability in repeating stamp motions arising from the fixing method is a major problem.

Here, a trial calculation will be made to see how many times a transfer is necessary when a 4K (3,840×2,160 pixels) RGB display is actually made with a microstructure-transfer apparatus. Supposing that one pixel is constituted using each one LED of the three colors of RGB, it is necessary to transfer 3,840×2,160×3=24,883,200 LEDs. Supposing that ten thousand pixels (thirty thousand LEDs) are transferred in one transfer, about 830 transfers are necessary to make one 4K-RGB display panel. This means that if one stamp component can withstand twenty thousand transfers, only about twenty-four 4K displays can be made with one stamp component.

Next, supposing that one transfer takes about 5 seconds, the time required for twenty thousand motions is 100,000 seconds. Accordingly, a stamp replacement will be necessary once every 28 hours (100,000 seconds/3,600 seconds) or so. Therefore, it is clear that operating rate of the apparatus will be greatly degraded unless the stamp can be easily replaced.

Next, when actual mass production is performed using the conventional technology, the stamp portion is to repeat moving motions continuously. A rubber-form material is mainly used in the stamp. Therefore, particles generated in the apparatus during transfer and then adhering to the stamp and the support becomes a major problem. The particles are divided broadly into two types: printed particles from the microstructures to be transferred; and electrified-and-floating particles in the apparatus. Particles adhered to the stamp have a great influence on degradation of production yield, and therefore, measures to reduce particles are indispensable.

CITATION LIST

Patent Literature

Patent Document 1: U.S. Pat. No. 7,943,941 B2
Patent Document 2: U.S. Pat. No. 7,927,976 B2

Non Patent Literature

Non Patent Document 1: Matthew A. Meitl, Zheng-Tao Zhu, Vipan Kumar, Keon Jae Lee, Xue Feng, Yonggang Y. Huang, Ilesanmi Adesida, Ralph G. Nuzzo & John A. Rogers, "Transfer printing by kinetic control of adhesion to an elastomeric stamp", Nature Materials Volume 5, 33-38 (2006)

SUMMARY OF INVENTION

Technical Problem

A first problem to be solved by the present invention relates to the structure of and a method for fixing a stamp. In the configuration of conventional technology as described above, the stamp itself has a complex structure, and there has been a problem that replacement to a stamp head is difficult and takes time. In addition, the stamp of the conventional technology has a feature of having flexibility even when fixed to the stamp head, and has a problem of having low fixing stability. In view of the above problems, the present invention provides: a stamp component that can be fixed stably by a simple and convenient vacuum chuck system; a stamp head unit with which the stamp component can be replaced in a short time; and a microstructure-transfer apparatus provided with the stamp component and the stamp head unit.

A second problem to be solved by the present invention is the adhesion of electrified-and-floating particles to the stamp during actual mass production operation. The present invention provides a stamp component provided with a structure for reducing particle adhesion to the stamp and a support.

Solution to Problem

To solve the above problems, a first aspect of the present invention provides a stamp head unit comprising:
- a stamp component comprising at least a silicone-based rubber film on a quartz glass substrate;
- a stamp-component-holding component comprising a surface having a hole for vacuum suction of a surface of the quartz glass substrate of the stamp component; and
- a tubular component having an evacuation suction hole connected to communicate with the hole for vacuum suction so as to maintain a vacuum, and being coupled and fixed with the stamp-component-holding component.

Such a stamp head unit makes it possible to replace the stamp component in a short time, and the stamp component can be fixed to a stamp-holding portion with certainty by vacuum suction.

The hole of the stamp-component-holding component for vacuum suction can be configured to be divided into a plurality of parts to fix the quartz glass substrate by suction in a plurality of points.

In this manner, local deflection due to vacuum suction can be prevented from occurring when the quartz glass substrate is thin. At the same time, the stamp component can be fixed and held more stably.

The stamp head unit can be configured so that a groove structure is formed on the surface of the stamp-component-holding component to which the stamp component is attached, the groove structure being connected to the evacuation suction hole via the hole for vacuum suction.

In this manner, suction force can be reduced with the same degree of vacuum suction on the part of the transfer apparatus or peripheral devices, etc. Therefore, local warpage in the sucked portion can be prevented, and the stamp head unit can also be used for a thin quartz glass substrate.

The quartz glass substrate is preferably a flat rectangular plate.

With this configuration, X-Y orthogonal axes become clear, and alignment in a θ direction becomes easy.

A facet is preferably formed in the quartz glass substrate.

In this manner, a point of reference for the quartz glass substrate with the stamp formed can be given in the θ direction, so that the stamp component can be replaced without mistaking the rotational positions of the facet and the stamp.

The tubular component is preferably configured to have a collet connector portion.

In this manner, it becomes possible to connect the stamp head unit accurately in a normal direction of the X-Y plane of the stamp, that is, in a Z-direction when connecting the stamp head unit to a transfer apparatus body. Note that methods for connecting the stamp head unit to the transfer apparatus body are not limited thereto, and other methods are also possible.

The surface of the stamp-component-holding component for holding the stamp component may comprise a convex structure for adjusting a position of the stamp component.

In this manner, it becomes possible to adjust the positions of the stamp component and an attachment surface easily when replacing the stamp.

The convex structure may be configured to have an orthogonal side surface.

In this manner, position adjustment in two directions of X and Y in the attachment surface can be performed easily. When the quartz glass substrate is a flat rectangular plate (cuboid), rough alignment in X, Y and θ can be performed easily just by pressing the two sides of X and Y of the quartz glass substrate against the orthogonal side surface of the convex structure. By providing a facet position on a vertex of the rectangular quartz glass substrate, and for example, by adjusting the vertex portion having the facet to the orthogonal corner of the convex structure, errors in mounting direction can be prevented on every replacement. As a result, replacement speed can be increased.

The silicone-based rubber film of the stamp component may be configured to have an alignment mark.

In this manner, it becomes possible to perform position alignment in X, Y, and θ of the stamp component with the donor substrate, and the stamp component with the receiving substrate by making the alignment mark on the donor substrate match the alignment mark on the receiving substrate. As a result, it becomes possible to transfer a microstructure with high precision. In addition, the alignment mark can also be used to correct the X, Y, and θ relative to the apparatus origin ($X=Y=0$) and angle of origin ($θ=0°$) in advance when the stamp component is mounted.

The quartz glass substrate is preferably synthetic quartz glass.

When the size of the microstructure is small, and the height is less than several tens of μm, flatness of the silicone-based rubber film to which the microstructure is to be adhered is important. In this case, variation is preferably approximately within the height of the microstructure. To achieve flatness in the silicone-based rubber film, flatness of the quartz glass substrate, being the base material thereof, has a great influence. In the case of synthetic quartz glass, in-plane film thickness uniformity (TTV: total thickness variation) of about 1 μm or less can be realized. Therefore, variation in film thickness of the entire stamp component can be minimized by using synthetic quartz glass. Another advantage of using synthetic quartz glass is that it is possible to achieve thermal stability when repeating microstructure transfer motions. That is, a synthetic quartz glass substrate has about ⅕ of the thermal expansion coefficient of other quartz glass substrates, and thermal strain during operation can be reduced. In particular, in the case of a stamp component having a convex-shaped projection, positional displacement of the projection and strain (distortion) due to thermal expansion and contraction can be reduced. Thus, an accurate transfer motion becomes possible.

A second aspect of the present invention is a microstructure-transfer apparatus comprising the inventive stamp head unit.

By using the inventive microstructure-transfer apparatus, it becomes possible to replace the stamp component easily and in a short time by the ON/OFF of vacuum suction, and a transfer apparatus suitable for mass production can be realized.

This is particularly effective when the stamp head unit is provided with a convex structure for physically providing a mounting-position alignment and when a person replaces the stamp component directly by hand, and enables simple and convenient replacement operation in a short time with high precision.

In this case, the inventive microstructure-transfer apparatus preferably comprises a mechanism for adjusting a position of a stamp surface (in X-Y orthogonal coordinates), a position in a Z-coordinate that is orthogonal to an X-Y plane, and rotation angle θ with a Z-axis as a center, of the stamp component mounted on the stamp head unit.

In this manner, the origin alignment correction of the positional relationship (in X, Y, Z, and θ) between the stamp origin and the apparatus origin can be performed by using the alignment mark provided on the stamp after mounting the stamp component on the stamp head unit. In addition, by alignment using the alignment mark of the stamp component and the alignment mark on the donor substrate, position alignment of the stamp component and the donor substrate in X, Y, and θ becomes possible. Similarly, by alignment using the alignment mark of the stamp component and the alignment mark on the receiving substrate, position alignment of the stamp component and the receiving substrate in X, Y, and θ becomes possible. As a result, high-precision transfer of a microstructure becomes possible. Moreover, when origin alignment correction has been performed, the time required for fine correction in the donor substrate and the receiving substrate can be shortened.

The inventive microstructure-transfer apparatus is preferably configured to comprise a stamp-component-replacement unit for replacing the stamp component.

Rough alignment of the stamp component can be carried out in the stamp-component-replacement unit in advance. The microstructure-transfer apparatus can move the stamp head unit to a predetermined position, perform a descending motion, and stop just before contacting the stamp component. The stamp component can then be sucked by vacuum suction to fix by suction. Subsequently, the stamp head unit can be raised, moved to a predetermined standby position, and wait. In this manner, the replacement operation can be carried out remarkably swiftly and with high precision compared to when a person replaces the stamp component by hand, so that mass-productivity can be greatly improved.

A third aspect of the present invention is a method for transferring a microstructure-integrated component, the method comprising:

transferring a microstructure by using the inventive microstructure-transfer apparatus.

For example, using the inventive microstructure-transfer apparatus, the desired LEDs can be transferred to pixel positions in a display, disposed, and fixed to manufacture a display panel having all pixels or a partial pixel area of the display. By transferring microstructures such as semiconductor lasers, IC chips, one-dimensional to three dimensional packages with compound-mounted IC and LSI, various functional devices including inorganic or organic semiconductors, electric circuit elements such as resistors, capacitors, and coils, various microsensor elements, various functional devices of MEMS (microelectromechanical system), and sensors and so on, instead of LEDs (organic/inorganic), according to the microstructure-transfer method of the present invention, a new functional product having a combination of these various functional devices, that is, a microstructure-integrated product can be manufactured.

A fourth aspect of the present invention is a stamp component for transferring a microstructure, the stamp component having at least one layer of a silicone-based rubber film formed on a synthetic quartz glass substrate.

The film thickness uniformity (flatness) of a synthetic quartz glass substrate can be made to be about 1 μm or less. Therefore, the thickness uniformity of the height of the adhesion face of the stamp component as a whole can be made small up to about 1 μm at most by raising the film thickness uniformity of the silicone-based rubber film. Note that the silicone-based rubber film uniformity can be set to a required value depending on the size and height of the microstructure to be transferred.

Furthermore, the biggest advantage in using synthetic quartz glass is that it is possible to achieve thermal stability when repeating microstructure transfer motions. That is, a synthetic quartz glass substrate has about ⅕ of the thermal expansion coefficient of other quartz glass substrates, and thermal strain during operation can be reduced. In particular, in the case of a stamp component having a convex-shaped projection, positional displacement of the projection and strain (distortion) due to thermal expansion and contraction can be reduced. Thus, an accurate transfer motion becomes possible.

By attaching to the stamp head unit of the transfer apparatus and using such a stamp component with little variation in the height of the face to be adhered to a microstructure and with little thermal expansion strain, stable adhesion and transfer motion become possible when transferring a plurality of microstructures at once. That is, when a silicone-based rubber film with a uniform film thickness is formed on a flat synthetic quartz glass substrate, it is possible to contact and press each microstructure uniformly when transferring microstructures at once even when the number of microstructures to be transferred is a plurality of 2 or more, and furthermore, even when the number is ten thousand or thirty thousand. In addition, the microstructures can be picked up from the donor substrate by the adhesion and tackiness of the silicone-based rubber film. When uniform adhesion is achieved as described, microstructures can be prevented from falling off while being moved. The stamp component having a uniform surface also exhibits its effect when transferring and disposing a microstructure onto a receiving substrate, so that the microstructure can be pressed onto the receiving substrate with a uniform force. The microstructure can be taken off from the silicone-based rubber film by forming on the receiving substrate side a film that adheres with a stronger force than the adhesive strength from the adhesion and tackiness of the silicone-based rubber film.

The synthetic quartz glass substrate may have a thickness of 0.5 mm to 7 mm.

In this way, a commercially available synthetic quartz glass substrate for synthetic quartz glass wafers and mask blanks, etc. can be used, and a flatness of about 1 μm or less becomes available. At the same time, there is also an advantage that production cost can be reduced.

The microstructure may be an LED, and there may be a difference of 18 μm or less between a maximum and minimum film thickness of a silicone-based rubber of the silicone-based rubber film in a face portion that adheres to the microstructure.

For example, when the LED has a thickness of 6 μm, the stamp component preferably has a variation of 18 μm, being 3 times the thickness, or less in film thickness. Supposing that LEDs are disposed and fixed on a flat surface, in this case, the silicone-based rubber film of the stamp component comes to be in a state of contacting all the LEDs when the stamp is pressed just 18 μm+6 μm, that is, 24 μm. Accordingly, by pressing appropriately by 24 μm or more and applying pressure, the adhesive strength (adhesion+tackiness) of the silicone-based rubber film when pressed in by at least 6 μm can be produced for all the LEDs. This additional pressing amount varies slightly depending on the size of the flat surface, height, and shape of the microstructure, and therefore, the amount can be determined by working out the conditions beforehand.

The stamp component for transferring a microstructure may have a conductive film between the synthetic quartz glass substrate and the silicone-based rubber film.

In this manner, an end portion of the quartz glass surface and periphery thereof where electrification is most concentrated can be prevented from becoming electrified. Thus, an adhering amount of electrified particles floating near the stamp component to the stamp component can be reduced when repeating transfer motions several tens of thousands of times in the transfer apparatus.

The conductive film may be formed to cover an entire surface of the synthetic quartz glass substrate.

In this manner, the advantageous effect of reducing the adhesion of electrified particles to the stamp component becomes more readily exhibited sufficiently.

The conductive film may contain a conductive material.

The conductive material is preferably at least one of carbon black, carbon filler, carbon nanowire, carbon nanotube, graphene, salt of alkali metal or alkaline-earth metal, and ionic liquid. Incidentally, a plurality of these conductive materials may be used in mixture.

The conductive material also preferably contains a conductive polymer.

As the conductive polymer, poly(3,4-ethylenedioxy thiophene) doped with poly(4-styrene sulfonic acid) (PEDOT/PSS) which is polythiophene-based, polyaniline sulfonic acid which is polyaniline-based, etc. can be used, for example. Note that the conductive polymer is not limited to the above-described conductive polymers, and other conductive polymers may be used. In addition, a combination of a conductive polymer and at least one of a carbon-based conductive material, salt of alkali metal, salt of alkaline-earth metal, and ionic liquid can also be used. When the conductive film contains a conductive material such as a carbon-based conductive material, salt of alkali metal, salt of alkaline-earth metal, ionic liquid, and conductive polymer, the conductivity of the conductive film can be freely adjusted by adjusting the amount of conductive material to be added.

The conductive film may be a conductive silicone-based rubber film.

In this manner, the advantageous effects of the present invention can be more easily exhibited.

The silicone-based rubber film can be a conductive silicone-based rubber film.

In this manner, electrification can be prevented on the entire surface of the stamp. Thus, an adhering amount of electrified particles floating near the stamp component to the stamp component can be reduced when repeating transfer motions several tens of thousands of times in the transfer apparatus.

The conductive silicone-based rubber film may contain a conductive material.

The conductive material contained in the conductive silicone-based rubber film is preferably at least one of, carbon black, carbon filler, carbon nanowire, carbon nanotube, graphene, salt of alkali metal, salt of alkaline-earth metal, and ionic liquid. Note that a plurality of these conductive materials may be used in mixture.

The conductive material contained in the conductive silicone-based rubber film also preferably contains at least a conductive polymer.

As the conductive polymer, poly(3,4-ethylenedioxy thiophene) doped with poly(4-styrene sulfonic acid) (PEDOT/PSS) which is polythiophene-based, polyaniline sulfonic acid which is polyaniline-based, etc. can be used, for example. Note that the conductive polymer is not limited to the above-described conductive polymers, and other conductive polymers may be used. In addition, a combination of a conductive polymer and at least one of a carbon-based conductive material, salt of alkali metal, salt of alkaline-earth metal, and ionic liquid can also be used. When the conductive film contains a conductive material such as a carbon-based conductive material, salt of alkali metal, salt of alkaline-earth metal, ionic liquid, and conductive polymer, the conductivity of the conductive film can be freely adjusted by adjusting the amount of conductive material to be added.

The stamp component for transferring a microstructure may comprise one convex-shaped projection on a surface of the silicone-based rubber film.

In this manner, microstructures that are densely disposed on the donor substrate can be selectively adhered and picked up, and transferred and disposed on the receiving substrate. Such a stamp component can be used for repairs, where a normal microstructure is selectively transferred to a place where there is a defective microstructure.

The stamp component for transferring a microstructure can comprise two or more convex-shaped projections on a surface of the silicone-based rubber film.

In this manner, two or more microstructures corresponding to the positions of the convex-shaped projections can be transferred at once.

The two or more convex-shaped projections may include convex-shaped projections having two or more different heights.

In this manner, two microstructures having different heights can be transferred at once.

The two or more convex-shaped projections may have a face portion that is to be contacted with a microstructure, and comprise convex-shaped projections whose face portions have two or more different areas.

In this manner, two microstructures of different sizes can be transferred at once.

The two or more convex-shaped projections may be optionally in a one-dimensional array or a two-dimensional array.

When two or more convex-shaped projections are configured to be disposed so that the microstructures on the donor substrate can be taken out in correspondence with the one-dimensional or two-dimensional array in this manner, a plurality of microstructures corresponding to the positions of the convex-shaped projections can be transferred at once. Thus, it becomes possible to transfer the microstructures in a desired layout.

The one-dimensional array or two-dimensional array may include a portion having a regularity with a fixed pitch.

In this manner, the portion can transfer a plurality of microstructures at once in a one-dimensional array or a two-dimensional array with a fixed pitch.

The fixed pitch may be an integer multiple of a pixel pitch of a display.

In this manner, a plurality of microstructures can be transferred to pixels separated from each other at a distance of the integer multiple of the display pixel pitch. In this case, when the microstructures are LED elements, an LED display can be made.

A cross sectional shape of the convex-shaped projection may be a trapezoidal shape.

In this manner, durability of the convex-shaped projection can be enhanced, so that the number of transfers that can be realized by one stamp component can be increased. That is, the service life of each stamp can be extended.

The cross sectional shape of the convex-shaped projection may include a portion that is a trapezoidal shape that is smaller in a tip side.

In this manner, the convex-shaped projection portion can apply pressure to the adhesion face evenly without bending in one direction when the convex-shaped projection of the silicone-based rubber film is pressed to the microstructure. As a result, stable adhesion becomes possible.

A cross sectional shape of the convex-shaped projection may be a stepped convex shape with two or more steps.

In this manner, it becomes possible to pick up the target chip with certainty without touching the next chip even when the microstructures are disposed at a narrower pitch. In addition, it is also possible to obtain a similar effect to when the endmost portion of the convex-shaped projection that is to be adhered to a microstructure has a tapered shape. Note that the projection portion of the first step may also have a tapered shape, and this is effective for realizing uniform pressing when the multistep projection has a vertically oriented aspect ratio.

A film thickness of the convex-shaped projection portion preferably has a height and size that correspond respectively to two or more microstructures having different heights and sizes.

In this manner, it becomes possible to transfer microstructures having different sizes and heights at once. For example, it also becomes possible to transfer at once and construct a peripheral circuit element that includes an LED in a central portion and a driver circuit in a periphery, etc.

A fifth aspect of the present invention is a stamp head unit for transferring a microstructure, the stamp head unit comprising the above-described stamp component for transferring a microstructure By using the inventive stamp head unit when manufacturing a product including a microstructure, it becomes possible to replace the stamp component simply, conveniently, and quickly. As a result, products can be manufactured with high mass-productivity. Furthermore, when the stamp head unit for transferring a microstructure, the stamp head unit having a stamp component provided with an antistatic structure, is used, the adhesion of floating-and-electrified particles to the stamp component during a transfer motion can be prevented. As a result, transfer errors due to particles can be prevented, so that the number of cleaning of the stamp component or the number of replacement operations can be reduced. Accordingly, this contributes greatly to the improvement of mass-productivity in the long run.

A sixth aspect of the present invention is a microstructure-transfer apparatus comprising the above-described stamp head unit.

By using the inventive microstructure-transfer apparatus when manufacturing a product including a microstructure, it becomes possible to replace the stamp component simply, conveniently, and quickly. As a result, products can be manufactured with high mass-productivity.

A seventh aspect of the present invention is a method for transferring a microstructure-integrated component, the method comprising:

transferring a microstructure by using the above-described microstructure-transfer apparatus.

According to the transfer method of the present invention, stamp-component-replacement time can be remarkably shortened, that is, operation with little downtime of the apparatus becomes possible, so that the production of microstructure-integrated products with high mass-productivity can be realized. Moreover, when the above-described stamp component provided with the antistatic structure is used in the inventive transfer method, microstructure-transfer errors caused by particles can be prevented and reduced. As a result, the mass-productivity in production of microstructure-integrated products can be greatly improved.

Advantageous Effects of Invention

As described above, according to the present invention, it becomes possible to perform a stamp component replacement simply and conveniently and in a short time by using a stamp head unit including: a stamp component including at least a silicone-based rubber film on a quartz glass substrate; a stamp-component-holding component including a surface having a hole for vacuum suction of a surface of the quartz glass substrate of the stamp component; and a tubular component having an evacuation suction tube connected to communicate with the hole for vacuum suction so as to maintain a vacuum, and being coupled and fixed with the stamp-component-holding component. As a result, it is possible to provide a microstructure-transfer apparatus provided with the inventive stamp head unit and having high mass-productivity. Accordingly, new products provided with a display panel with micro-LEDs with short sides of less than 100 µm or micro-semiconductor devices can be manufactured with excellent mass-productivity by using the inventive microstructure-transfer apparatus.

Furthermore, by using the inventive stamp component that uses a conductive material in the microstructure-transfer apparatus in addition to the inventive stamp head unit, it becomes possible to prevent and reduce the adhesion of floating-and-electrified particles to the stamp component during microstructure transfer. As a result, it becomes possible to reduce substantially the frequency of stamp cleaning and stamp replacement, so that continuous operation suited to mass production can be realized.

BRIEF DESCRIPTION OF DRAWINGS

FIG. 1 is a configuration diagram of a stamp head unit in a first embodiment of the present invention.

FIG. 2 is a configuration diagram of a stamp head unit in a second embodiment of the present invention.

FIG. 3 is a configuration diagram of a stamp head unit in a third embodiment of the present invention.

FIG. 4 is a configuration diagram of a stamp head unit in a fourth embodiment of the present invention.

FIG. 5 is a configuration diagram of a stamp head unit in a fifth embodiment of the present invention.

FIG. 6 is a schematic configuration diagram of an operation part of a microstructure-transfer apparatus in a sixth embodiment of the present invention.

FIG. 7 is an explanatory diagram of stamp components including alignment marks in a seventh embodiment of the present invention.

FIG. 8 shows cross sectional views of stamp components in an eighth embodiment of the present invention.

FIG. 9 shows cross sectional views of stamp components for transferring multiple types of microstructures at once in a ninth embodiment of the present invention.

FIG. 10 is a configuration diagram of an antistatic stamp component in a tenth embodiment of the present invention.

FIG. 11 is a different configuration diagram of an antistatic stamp component in the tenth embodiment of the present invention.

FIG. 12 shows cross sectional views of antistatic stamp components in an eleventh embodiment of the present invention.

FIG. 13 shows different cross sectional views of antistatic stamp components in the eleventh embodiment of the present invention.

FIG. 14 shows FIG. 2(A), (B), (C), and (D) of U.S. Pat. No. 7,927,976 B2.

DESCRIPTION OF EMBODIMENTS

As described above, it has been desired to develop a stamp component that can be fixed stably by a simple and convenient vacuum chuck system, a stamp head unit that enables the stamp component to be replaced in a short time, and a microstructure-transfer apparatus including the stamp component and the stamp head unit. In addition, it has been desired to develop a stamp component provided with a structure for reducing the adhesion of particles to a stamp and a support.

The present inventors have earnestly studied the above problems, and found out that by the ON/OFF of vacuum suction on a surface of a quartz glass substrate of a stamp component for transferring a microstructure where the stamp component has at least one layer of a silicone-based rubber film formed on the synthetic quartz glass substrate, the stamp component can be replaced easily and in a short time, and a transfer apparatus suitable for mass production can be realized. Based on the findings, the present invention has been completed.

That is, a first aspect of the present invention is a stamp head unit including:
 a stamp component including at least a silicone-based rubber film on a quartz glass substrate;
 a stamp-component-holding component including a surface having a hole for vacuum suction of a surface of the quartz glass substrate of the stamp component; and
 a tubular component having an evacuation suction hole connected to communicate with the hole for vacuum suction so as to maintain a vacuum, and being coupled and fixed with the stamp-component-holding component.

A second aspect of the present invention is a microstructure-transfer apparatus including the stamp head unit.

A third aspect of the present invention is a method for transferring a microstructure-integrated component, the method including:
 transferring a microstructure by using the microstructure-transfer apparatus.

A fourth aspect of the present invention is a stamp component for transferring a microstructure, the stamp component having at least one layer of a silicone-based rubber film formed on a synthetic quartz glass substrate.

A fifth aspect of the present invention is a stamp head unit for transferring a microstructure, the stamp head unit including the stamp component for transferring a microstructure.

A sixth aspect of the present invention is a microstructure-transfer apparatus including the stamp head unit.

A seventh aspect of the present invention is a method for transferring a microstructure-integrated component, the method including:
 transferring a microstructure by using the microstructure-transfer apparatus.

Hereinafter, the present invention will be described in detail, but the present invention is not limited thereto.

Embodiment 1

FIG. 1 is a configuration diagram of a stamp head unit 100 in a first embodiment of the present invention. FIG. 1(*a*) is a cross sectional view of the stamp head unit, and FIG. 1(*b*) is a plan view of the stamp head unit in FIG. 1(*a*) seen from below.

In FIG. 1, "1" is a stamp-component-holding component, "2" is a vacuum suction hole, "3" is a stamp-component-holding surface, "4" is a tubular component, and "5" is an evacuation suction hole. "6" is a quartz glass substrate and "7" is a silicone-based rubber film, and these constitute a stamp component 13.

The vacuum suction hole 2 is inside the stamp-component-holding component 1, and is formed so that the vacuum suction hole 2 reaches the stamp-component-holding surface 3. The tubular component 4 is coupled and fixed to the stamp-component-holding component 1 in a state of being buried inside the stamp-component-holding component 1, and in such a state that the evacuation suction hole 5 and the vacuum suction hole 2 are connected to communicate so as to maintain a vacuum. In the present first embodiment, the vacuum suction hole 2 is provided in one place in approximately the center of the stamp-component-holding surface 3. A stamp head unit with such a structure can of course be used in mass production, and is also useful when used with the stamp component 13 switched to have various sizes in development stage.

Note that the course of the holes of the vacuum suction hole 2 and the evacuation suction hole 5 do not necessarily need to have a connection in a straight line as in the present first embodiment. Any form may be adopted as long as an effect at least equivalent to that of the present first embodiment or higher can be achieved. For example, a structure in which the evacuation suction hole 5 for vacuum suction is taken out sideways from the piping component is also possible.

With the above-described configuration, the surface of the quartz glass substrate (the upper surface of the quartz glass substrate 6 in FIG. 1(*a*)) of the stamp component including the quartz glass substrate 6 and at least a silicone-based rubber film 7 is fixed and held to the stamp-component-holding surface 3 by vacuum suction by being vacuum-sucked through the evacuation suction hole 5.

When the inventive stamp head unit having the above-described configuration is used, the stamp component including at least the silicone-based rubber film 7 on the quartz glass substrate 6 can be simply and conveniently removed and attached just by the ON/OFF operation of vacuum suction. Therefore, replacement can be performed in a short time. Note that the stamp component may include one layer or a plurality of layers of film between the quartz glass substrate 6 and the silicone-based rubber film 7.

The side of the tubular component 4 that is not coupled with the stamp-component-holding component 1 is fixed to a stamp-head-moving portion of a microstructure-transfer apparatus not shown, and is used. In this event, as an unshown microstructure-transfer apparatus or as an accessory device thereof, a vacuum suction equipment is provided.

Note that the method for connecting and fixing the tubular component 4 of the inventive stamp head unit to a stamp head of a microstructure-transfer apparatus may be any method as long as the necessary functions and performance can be ensured. A collet connector system allows simple and convenient mounting, and attachment precision can be easily achieved. The tubular component 4 in a state of being fixed in a normal direction of the stamp-component-holding surface 3 is the simplest and most convenient, and this is also the simplest and most convenient structure in view of the connection to the unshown stamp-head-moving portion of the microstructure-transfer apparatus. It is sufficient for the surface of the silicone-based rubber film 7 to be configured to form a parallel plane to a donor substrate on which a microstructure is disposed and a receiving substrate to which the microstructure is to be transferred, in a state where the inventive stamp head unit is mounted on the stamp-head-moving portion of the transfer apparatus.

Meanwhile, the silicone-based rubber film 7 is a film containing a polymer having at least a siloxane skeleton, or a film containing a polymer having a skeleton in which a siloxane skeleton and another polymer skeleton are bonded or polymerized, and is a film having rubber property after curing. Well known simple examples include polydimethylsiloxane (PDMS), but by devising various structures such as those in which a part of the methyl groups in a side chain have a functional group other than a methyl group, and those in which structures having a linear or branched chain including a silicone skeleton are bonded, etc., rubber property can be optimized. Rubber property can also be optimized by condensation polymerization of siloxane provided with various functional groups provided on a terminal thereof, and by making a copolymer made by copolymerization with a different polymer.

As a base material of the quartz glass substrate 6, that is, a base material of $SiO_2$, it is possible to use soda-lime glass, alkali-free glass, fused quartz glass, synthetic quartz glass, etc. However, synthetic quartz glass is the most preferable from the viewpoints of high flatness, high homogeneity, low coefficient of thermal expansion, and high UV transmittance suitable for the purpose of the present invention.

Incidentally, soda-lime glass and alkali-free glass are usually unacceptable in view of flatness. Meanwhile, fused quartz glass can achieve flatness and surface uniformity of nearly the same level as synthetic quartz glass if polishing of the same level as synthetic quartz glass is performed. However, since cavity defects are sometimes contained inside from the beginning, local uniformity defects sometimes occur.

Regarding surface uniformity of a synthetic quartz glass substrate, flatness is about 0.1 μm or less by TTV. By forming, with a uniform film thickness, a silicone-based rubber film 7 on a quartz glass substrate 6 with thickness uniformity, it becomes possible to form a flat surface that is uniform as the stamp component 13 (6 and 7) as a whole.

The thickness of the quartz glass substrate can be used at about 0.5 mm, when the suction side is optimized so as not to be affected by a strain caused by vacuum suction. The thickness is preferably about 0.5 mm or more in view of handling as a stamp component 13 and in view of mechanical strength. For practical purposes, when the film thickness of the synthetic quartz glass substrate is about 1 mm or more, deformation strain due to vacuum suction does not occur. However, when measures such as dispersing the vacuum suction portions are taken, about 0.5 μm or more is sufficient.

From the viewpoints of thickness uniformity and production cost, standardized articles of synthetic quartz glass wafers that are already commercially available are preferably used as the quartz glass substrate. For example, when a synthetic quartz glass wafer for semiconductors is to be used, there are synthetic quartz glass substrates of a plurality of thicknesses such as a thickness of 0.7 mm, 1.2 mm, and 3 mm. Meanwhile, when a quartz glass substrate for mask blanks are to be used, there are multiple types of substrates such as a substrate of 6.35 mm. Incidentally, it is easy to further polish the quartz glass substrates with the above thicknesses to adjust the film thickness to be slightly thinner for use. When the short side of the stamp component face that is determined from the size and number of the microstructures to be transferred is about 7 mm or more, the shape becomes such that the aspect ratio in the thickness direction to the surface direction becomes less than 1 when the film thickness of the synthetic quartz glass substrate is about 7 mm or less. Thus, stable mounting becomes possible when mounted on the stamp head unit. Similarly, in the case of an even smaller stamp, the thickness of the synthetic quartz glass can be selected so that the aspect ratio in the thickness direction to the surface direction becomes less than 1.

As the size of the stamp component 13, about several 10 mm square to 100 mm square is practical. The practical thickness of the quartz glass substrate 6 also depends on the size (size and height) of the stamp component 13 and pressure to the microstructure, and so forth. Therefore, it is important to select a quartz glass substrate with a suitable thickness, and a suitable quartz glass substrate can be used as convenient.

Next, the effect of low coefficient of thermal expansion of a synthetic quartz glass substrate derived from homogeneity of quartz glass will be described.

To form the silicone-based rubber film 7, a rubber film is usually formed by heat-curing with a heater, irradiation with infrared radiation, etc. or by UV-curing after forming a film. In the case of heat-curing, homogeneity of the quartz glass is important. When the quartz glass is homogeneous, thermal expansion coefficient becomes constant everywhere, so that the stress strain in the interface between the quartz glass substrate and the silicone-based rubber film after heat-curing can be reduced. In either method for forming a rubber film, a synthetic quartz glass is the most suitable for the purpose. When a homogeneous rubber film can be formed, stress strain depending on the position can be reduced in the case of a flat plate silicone-based rubber film stamp. Thus, homogeneous tackiness can be achieved whichever part of the silicone-based rubber film a microstructure is picked up with. Furthermore, when forming a stamp having a plurality of convex-shaped projections described below, positional displacement of the convex-shaped projections can be minimized. This means that displacement of a transfer position can be suppressed to a minimum when transfer motions are performed continuously.

The thermal expansion coefficient of synthetic quartz glass is 6.5 E-7/° C. (0 to 1,000° C.), about 31 E-7/° C. (0 to 300° C.) in the case of soda-lime glass, and about 33 E-7 (20 to 300° C.) in the case of alkali-free glass. Therefore, synthetic quartz glass at least has about ⅕ of the coefficient of thermal expansion of other glass, and synthetic quartz glass is the most preferably used as the quartz glass substrate 6.

Another reason for using a quartz glass substrate 6 is that the silicone-based rubber film can be UV-cured. In particular, synthetic quartz glass has a light transmittance of 90% or higher regarding UV light with a wavelength of about 190 nm to about 400 nm used for UV-curing. UV-light transmittance of a synthetic quartz glass substrate and uniformity of the in-plane distribution thereof is the most excellent compared with other quartz glass, and a silicone-based rubber film can be uniformly UV-cured even when irradiated with a UV light from the quartz glass substrate side. When UV curing is employed, it is also possible to achieve an advantage that shrinking due to curing can be considerably reduced compared with heat-curing. As described, when a synthetic quartz glass substrate is used, it becomes possible to UV-cure from either the silicone-based rubber film side or the quartz glass substrate side. To be precise, the optimum wavelength of the light to be used for UV-curing depends on the composition of the material of the silicone-based rubber film 7, but for practical use, a 365-nm i-line high-pressure mercury lamp, a laser diode, etc. can be used.

As described above, by using a synthetic quartz glass substrate, a stamp with a silicone-based rubber film can be made with higher precision and more homogeneously than other quartz glass when making the stamp by either method of heat-curing or UV-curing.

A metal such as stainless steel and copper may be used as a material for the stamp-component-holding component 1. Considering that the quartz glass substrate 6 is to be vacuum-sucked, it is further preferable to use resin, which has a softer surface than metal. For example, a polyacetal resin such as polyimide resin, fluorine resin, and polyoxymethylene, and a so-called engineering plastic or super-engineering plastic such as high-density or ultra-high molecular weight polyethylene resin and polyetheretherketone resin can be used.

As a material for the tubular component 4, a metal material such as stainless steel is preferably used. A piping that is originally used as a tubular piping having a circular cross section may be used, or a cylindrical or polygonal bulk material may be drilled and used.

Note that although an example where the quartz glass substrate has a rectangular shape is shown in the present embodiment, a circular shape or a polygonal shape are also possible. For example, in the case of a quartz glass substrate with a circular shape, when a stamp surface of about 70 mm square or less is necessary, a silicone-based rubber film can be formed in a desired shape on a 4-inch (diameter: 100 mm) quartz glass substrate. For example, when a stamp surface of about 70 mm square or less to 100 mm or less is necessary, a 6-inch wafer (diameter: 150 mm) can also be used as it is. It is also possible to make the surface for holding the stamp component a circular or polygonal shape accordingly.

In the present invention, a microstructure means, in a broad sense, a micro-object of about several mm or less. Specifically, objects to be the microstructure include IC chips, one-dimensional to three-dimensional packages with compound-mounted IC and LSI, devices including inorganic or organic semiconductors such as light-emitting diodes (LEDs), and electric circuit elements such as resistors, capacitors, and coils. Devices having a size that cannot be handled by an ordinary chip bonder apply. In particular, in the case of LEDs, demands for devices with a size of several hundred μm or less are rising.

When the microstructure is an LED, and is a so-called mini-LED, which is an LED with a short side of 100 μm or more to several hundred μm, LEDs with a height of 100 μm to 130 μm are currently available. In the case of a so-called micro-LED, with a short side of less than 100 μm, and furthermore, 50 μm or less, a sapphire substrate layer is removed, and the thickness becomes 6 μm. In such a case, the in-plane variation of the face portion of the stamp component 13 to be adhered to the microstructure is preferably approximately several times the thickness (height) of the LED.

Moreover, a micro-object other than electrical and electronic circuit devices that cannot be picked up directly by vacuum suction can also be transferred and assembled at will using the inventive microstructure-transfer apparatus, and can be a microstructure to be transferred in the present invention.

Since the durability of a silicone-based rubber film is not limitless and performance drops after several tens of thousands of transfer motions, replacement operation becomes necessary. According to the calculation in the description of the conventional example, one stamp-component replacement becomes necessary every 28 hours. In conventional technology, this replacement operation itself takes time, and including time for position-checking after the replacement and teaching operation, etc., the operation is an extremely great loss of time for mass production. However, when the inventive stamp head unit is used, the stamp component 13 (6 and 7) can be replaced easily by ON/OFF switching of vacuum suction.

Embodiment 2

FIG. 2 shows a configuration diagram of a stamp head unit 200 in a second embodiment of the present invention.

In FIG. 2, "1" is a stamp-component-holding component, "2" is a vacuum suction hole, "3" is a stamp-component-holding surface, "4" is a tubular component, and "5" is an evacuation suction hole. "6" is a quartz glass substrate and "7" is a silicone-based rubber film, and these constitute a stamp component 13. FIG. 2(a) is a cross sectional view of the stamp head unit, and FIG. 2(b) is a plan view of the stamp head unit in FIG. 2(a) seen from below. Note that in FIG. 2(b), the quartz glass substrate 6 and the silicone-based rubber film 7 are not shown to make the vacuum suction holes 2 easier to see.

A difference between the second embodiment of the present invention and the first embodiment of the present invention is that not one, but a plurality of vacuum suction holes 2 are provided. In the second embodiment of the present invention, the vacuum suction hole 2 is divided into a plurality of small vacuum suction holes 2 that lead to the evacuation suction hole 5 of the tubular component 4. In FIG. 2(b), the vacuum suction holes 2 are laid out in an 8×6 matrix form. By vacuum-sucking the quartz glass substrate 6 in a plurality of small spots in this manner, it is possible to prevent the quartz glass substrate from being slightly deformed by vacuum suction pressure in sucked portions. The vacuum suction pressure is roughly determined by the conductance that is determined by the suction capacity of an unshown vacuum suction equipment and the hole size of the vacuum suction holes 2. Therefore, the suction capacity and the hole size can be optimized and applied within a range in which the quartz glass substrate 6 does not become deformed.

Note that the number and layout of the vacuum suction holes 2 can be freely optimized depending on the size of the stamp component 13 (6 and 7) to be used.

When using the stamp head unit of the second embodiment of the present invention as described, it becomes possible, by optimizing the size and layout of the vacuum suction holes 2, to vacuum-suck the stamp component 13 in a quartz glass substrate with a practical thickness of about 0.5 mm or more without generating local micro-strains in the vacuum suction hole positions in the quartz glass substrate. In addition, since a stamp component 13 provided with at least a silicone-based rubber film 7 on a quartz glass substrate 6 can be simply and conveniently removed and attached just by an ON/OFF operation of vacuum suction, the stamp component 13 can be easily replaced in a short time. Furthermore, when held with a plurality of vacuum suction ports, the stamp component 13 can be fixed and held more stably by the holding component.

Note that even when the thickness of the quartz glass substrate is 0.5 mm or less, adjustments can be made by optimizing the size and layout of the vacuum suction holes 2 so as to allow vacuum suction of the stamp component 13 without generating local micro-strains in the vacuum suction hole positions in the quartz glass substrate.

In addition, when the disposition range in which the vacuum suction holes 2 are laid out is made rather small, it is also useful when stamp components 13 of various sizes are exchanged and used in development stage.

Embodiment 3

FIG. 3 shows a configuration diagram of a stamp head unit 300 in a third embodiment of the present invention. FIG. 3(*a*) is a cross sectional view of the stamp head unit, and FIG. 3(*b*) is a plan view of the stamp head unit in FIG. 3(*a*) seen from below. Note that in FIG. 3(*b*), the quartz glass substrate 6 and the silicone-based rubber film 7 are not shown.

A difference between the third embodiment of the present invention and the first embodiment of the present invention is that the vacuum suction hole 2 of the first embodiment is changed to be a connected groove structure 8.

"3'" is a part of the stamp-component-holding surface 3, and is a part that has been left in an island shape by making the groove structure 8. With such a structure, the quartz glass substrate 6 can be vacuum-sucked while maintaining flatness with the stamp-component-holding surface 3 and parts 3' of the stamp-component-holding surface 3. The width of the grooves in FIG. 3 are drawn large for illustrative convenience. However, the width of the grooves, the number of grooves, and the total area of the grooves can be designed so as to achieve vacuum pressure at the time of vacuum suction, and so that micro-deformation does not occur in the suction grooves even with a vacuum suction pressure and a quartz glass substrate with a thickness of 0.5 mm.

Using the stamp head unit 300 of the third embodiment of the present invention as described allows, by optimizing the groove structure of the vacuum suction hole 2, sufficient suction force necessary for transfer motions and vacuum suction that does not cause strain in the quartz glass substrate. In addition, since a stamp component 13 provided with at least a silicone-based rubber film 7 on a quartz glass substrate 6 can be simply and conveniently removed and attached just by an ON/OFF operation of vacuum suction, the stamp component 13 can be replaced easily in a short time. There is also an advantage that the stamp component 13 can be held stably.

Note that even when the thickness of the quartz glass substrate is 0.5 mm or less, adjustments can be made by optimizing the groove structure so as to allow vacuum suction of the stamp component 13 without generating local micro-strains in the vacuum suction hole positions in the quartz glass substrate.

In addition, when the disposition dimensions of the layout of the vacuum suction hole 2 are made rather small, it is also useful when stamp components 13 of various sizes are exchanged and used in development stage.

Embodiment 4

FIG. 4 shows a configuration diagram of a stamp head unit 400 in a fourth embodiment of the present invention. FIG. 4(*a*) is a cross sectional view of the stamp head unit, and FIG. 4(*b*) is a plan view of the stamp head unit in FIG. 4(*a*) seen from below. In FIG. 4, "9" is a convex-shaped projection, and the present fourth embodiment shows an example where the silicone-based rubber film is provided with convex-shaped projections 9. A convex-shaped projection means a projection having a convex shape in a cross sectional shape parallel to the Z-axis.

"10" is a convex structure portion, and is provided on the stamp-component-holding surface 3.

Differences between the fourth embodiment of the present invention and the first embodiment of the present invention are a silicone-based rubber film 7 provided with a convex-shaped projection 9 and a convex structure portion 10 on a stamp-component-holding surface 3.

Hereinafter, functions and effects of parts that are different from the first embodiment will be described.

The convex structure portion 10 is a mechanism for aligning the stamp head unit 400 and the stamp component 13 of the embodiment of the present invention in X, Y, and θ. FIG. 4 shows an instance where the convex structure is formed in an X-direction and a Y-direction and has a rectangular cross section. The convex structure portion 10 is coupled in a state where the convex structure portion 10 has orthogonal side surfaces in X- and Y-directions. As shown in FIG. 4(*b*), when a rectangular-shaped quartz glass substrate 6 is used, alignment of X, Y, and θ can be performed easily by adjusting a vertex of the quartz glass substrate to the orthogonal parts of the convex structure portion 10. For further practicality, high-precision adjustment becomes possible by further performing a fine alignment on the part of a microstructure-transfer machine to which the stamp head unit 400 of the embodiment of the present invention is mounted.

When the stamp head unit 400 of the fourth embodiment of the present invention is used as described, rough alignment can be made easily in X, Y, and θ when mounting the stamp component 13. As a result, not only can a stamp component 13 provided with at least a silicone-based rubber film 7 on a quartz glass substrate 6 be simply and conveniently removed and attached just by an ON/OFF operation of vacuum suction, the stamp component 13 can be replaced simply and conveniently in a short time while simply performing a rough alignment in X, Y, and θ. The stamp head unit 400 in the fourth embodiment of the present invention is particularly useful when a person replaces the stamp component 13 by hand.

Note that the convex structure portions in the X-direction and the Y-direction does not necessarily need to be coupled to each other, and may be separated from each other.

The present embodiment shows an example where the quartz glass substrate has a rectangular shape, but circular shapes or polygonal shapes are also possible. In the case of a circular shape, the convex structure portion 10 can be configured so that alignment can be made using a facet or a notch of a quartz glass wafer substrate.

Note that the cross sectional shape of the convex-shaped portion does not necessarily need to be rectangular. At least the surface of the convex-shaped portion 9 to be contacted with the quartz glass substrate is preferably approximately perpendicular to the stamp-component-holding surface 3. In addition, the height of the convex-shaped structure portion 10 may be the same as the height of the quartz glass substrate 6, but is preferably about ½ to ⅔.

Next, using a silicone-based rubber film 7 having a convex-shaped projection 9, unnecessary contact between adjacent microstructures and the silicone-based rubber film 7 can be eliminated when actually attached to a microstructure-transfer machine to adhere and pick up microstructures densely disposed at minute intervals, or when the picked-up microstructures are densely redisposed.

The silicone-based rubber film 7 having the convex-shaped projection 9 is intended for selectively adhering and transferring microstructures such as LEDs disposed and fixed to a donor substrate. In this case, selective adhering and transfer cannot be realized unless the pressing amount is the height of the convex-shaped projection or less. Therefore, supposing that the height of the convex-shaped projection is 100 µm, 80% (80 µm), in some cases, 50% (50 µm) of the height becomes the maximum amount that the stamp component 13 can be pressed in. For example, when an additional pressing amount is about 5 µm to 10 µm, the total pressing amount can be 29 µm to 34 µm, and a convex-shaped projection with a height of 100 µm can address the situation sufficiently. In addition, a convex-shaped projection with a height of 50 µm is also sufficient.

One method for raising the permissible pressing amount of the stamp component 13 is to raise the height of the projection. Another method is to reduce the in-plane variation (the total variation in film thickness of the synthetic quartz glass and the convex-shaped projection) of the face portion of the stamp component 13 to be adhered to a microstructure. The latter is of course preferable from the viewpoint of a user. Therefore, for an LED with a height of 6 µm, for example, it is sufficient for the in-plane variation of the face portion of the stamp component 13 to be adhered to a microstructure to be twice the height of the LED, 12 µm, and once the height, 6 µm is further preferable. It is obvious that a stamp component 13 with such an in-plane variation is compatible with transfer of a mini-LED.

Note that the in-plane variation of the face portion of the stamp component 13 to be adhered to a microstructure means the total variation in film thickness of the synthetic quartz glass substrate and the face portion of the silicone-based rubber film to be adhered to a microstructure. Meanwhile, the face portion of the silicone-based rubber film 7 to be adhered to a microstructure means a surface of the convex-shaped projection 9.

When an adhesive material on the side of a receiving substrate is configured in such a manner that a sufficient difference can be made between the adhesive strength of the convex-shaped projection 9 to a microstructure and the adhesive strength of the receiving substrate and the microstructure, the surface (contact surface) of the convex-shaped projection 9 to be contacted with the microstructure is preferably formed to have a little larger size than the microstructure for the convex-shaped projection 9 to pick up the microstructure more stably. For example, when the upper-surface size of the microstructure is about 10 µm to 100 µm, the contact surface of the convex-shaped projection 9 is preferably designed to have a width wider than the width of the microstructure in every direction by at least about 10% or more. Note that the contact surface is preferably larger than a stamp-head-unit movement accuracy of the transfer apparatus.

The height of the convex-shaped projection 9 is also dependent on the size of the microstructure, but can be adjusted to the optimum height within about several times to about 15 times the height of the microstructure. For example, when the microstructure has a height of 6 µm, the height of the convex-shaped projection 9 can be about 12 µm to about 100 µm. Note that the film thickness of parts of the silicone-based rubber film 7 other than the convex-shaped projection can be optimized according to the material characteristics of the silicone-based rubber film to be used and the size of the microstructure.

Note that the contact surface of the convex-shaped projection 9 with the microstructure can be an approximately flat surface.

However, when the microstructure is large, and sufficient adhesive strength can be achieved between the convex-shaped projection 9 and the microstructure, the adhesion face of the convex-shaped projection can be configured to be smaller than the surface of the microstructure.

Note that although the convex structure 10 for alignment at the time of stamp-component replacement and the convex-shaped projection 9 have been shown together in one drawing as an embodiment in the present fourth embodiment, the advantageous effects of the convex structure portion 10 and the convex-shaped projection 9 each act and function independently.

Embodiment 5

FIG. 5 shows a configuration diagram of a stamp head unit 500 in a fifth embodiment of the present invention. FIG. 5(a) is a cross sectional view of the stamp head unit, and FIG. 5(b) is a plan view of the stamp head unit in FIG. 5(a) seen from below. "6'" is a facet, and is provided in the upper left vertex of the rectangular surface of the quartz glass substrate 6 when seeing FIG. 5(b) from above.

The only difference between the fifth embodiment and the fourth embodiment of the present invention is whether or not there is a facet. Mounting errors in the rotation direction in the θ-direction can be prevented from occurring just by adjusting the position of the facet 6' as in FIG. 5(b). As a result, the efficiency of replacement operation can be further raised.

Note that although the present embodiment shows an example where the quartz glass substrate has a rectangular shape, a circular shape or a polygonal shape is also possible. In particular, in the case of a circular shape, the convex structure portion 10 can be configured so that alignment can be made using a facet or a notch of a quartz glass wafer substrate.

Embodiment 6: Transfer Apparatus

FIG. 6 shows a schematic configuration diagram of an operation part of a microstructure-transfer apparatus 110 in a sixth embodiment of the present invention. FIG. 6(a) shows a schematic configuration diagram of a case where a person replaces a stamp component 13 by hand, and FIG. 6(b) shows a schematic configuration diagram of a case where a transfer apparatus replaces a stamp component 13 automatically.

In FIG. 6, "11" is a stamp-head-moving portion. "12" is a stamp-component-holding portion including a stamp-component-holding component 1 and a tubular component 4, and "13" is a stamp component 13 including a quartz glass substrate 6 and at least a silicone-based rubber film 7, and these show the inventive stamp head unit as a whole. The stamp-component-holding portion 12 is connected to the stamp head moving portion. "14" is a microstructure, "15" is a donor substrate for supplying the microstructure, and "16" is a donor substrate stage. The microstructure 14 is disposed and temporarily fixed on the donor substrate 15. "17" is a receiving substrate, and "18" is a receiving substrate stage. "19" is a stamp-component-replacement stage, and "20" is a stamp component holder. Note that as an unshown microstructure-transfer apparatus or as an accessory device thereof, a vacuum suction equipment is provided. A vacuum piping is connected to the stamp-component-holding portion 12, and is configured to allow switching by the ON/OFF of vacuum evacuation.

FIG. 6 is only a schematic view for explaining a basic operation, and shows the minimal constitutional elements. The transfer operation of a microstructure will be briefly described with reference to FIG. 6.

A case where a person replaces a stamp component 13 by hand will be described with reference to FIG. 6(*a*).

(#) in FIG. 6 where #=1, 2, 3 . . . show sequence numbers of the operation.

Firstly, (1) the stamp-head-moving portion 11 is moved to a position A for replacing the stamp component 13, and the stamp component 13 is brought to the stamp component holding portion 12 by hand, and vacuum is switched to ON to attach and fix the stamp component 13. (2) The stamp-head-moving portion 11 is moved to a desired position in a position B where the donor substrate stage 16 is. (3) The stamp-head-moving portion 11 is lowered, and the stamp component 13 is pressed to a desired microstructure 14 disposed and temporarily fixed on the donor substrate 15. (4) The microstructure 14 is picked up by the stamp component 13, and the stamp-head-moving portion 11 is raised. (5) Maintaining this state, the stamp-head-moving portion 11 is moved to a position C where the receiving substrate stage 18 is. (6) The stamp-head-moving portion 11 is lowered to press the microstructure 14 to a desired position on the receiving substrate 17. (7) The microstructure 14 is received by the receiving substrate 17, and the stamp-head-moving portion 11 is raised. (8) The stamp-head-moving portion 11 is returned to the position B. The series of microstructure transfer motions from (3) to (8) are repeated to complete the desired transfer operation.

In order to adhere and pick up the microstructure 14 from the donor substrate 15 in the transfer motion (4), the adhesive strength of the silicone-based rubber film of the stamp component 13, that is, "adhesion+tackiness" can be set to be stronger than the adhesive strength of the donor substrate surface to which the microstructure 14 is temporarily fixed. Meanwhile, in order to make the receiving substrate receive the microstructure 14 in the transfer motion (7), the adhesive strength of the receiving substrate surface can be set to be stronger than the adhesive strength of the silicone-based rubber film of the stamp component 13. Note that a transfer operation using a stamp with only adhesive strength in this manner is possible, but other methods may also be employed. Examples of the methods include irradiating the interface between the surface of the donor substrate 15 and the microstructure 14 with a laser beam from the back surface of the donor substrate to destroy the composition of the upper-most surface layer of the donor substrate 15 and eliminate the adhesive strength of the donor substrate surface selectively.

When the transfer motions are repeated as described above, the adhesion and tackiness of the stamp will eventually become lower than the adhesive strength necessary for the transfer motions. Therefore, before reaching the life limit of the adhesive strength of the stamp, (9) the stamp-head-moving portion 11 is moved to the stamp-component-replacement position, the vacuum is switched to OFF, and the used stamp component 13 is manually detached. Subsequently, a new stamp component 13 is mounted by the motion (1), and the next transfer motion is to be performed. If the inventive stamp head unit is used in this event, replacement can be performed easily just by the ON/OFF of vacuum as described above, so that it becomes possible to replace the stamp component 13 in a short time. Note that when the stamp head unit shown in the embodiment 4 of the present invention is used, rough alignment in X, Y, and θ can be realized quite accurately every time despite the mounting being performed by hand.

Next, a case where a stamp component 13 is replaced automatically by a transfer apparatus will be described with reference to FIG. 6(*b*).

Parts that are different from the manual case of FIG. 6(*a*) are motions (11) and (12) of FIG. 6(*b*). A motion for the automatic replacement of the stamp component 13 can be executed as follows.

Stamp-component-attachment motion: (11) after the stamp-head-moving portion 11 is moved to the position A for replacing the stamp component, the stamp-head-moving portion 11 is lowered. When the vacuum is switched to ON in a state where the surface of the stamp-component-holding component 1 of the stamp-component-holding portion 12 is not contacted with the quartz glass substrate surface of the stamp component 13 and in a state where the stamp-head-moving portion 11 has been moved as close as possible, the stamp component 13 is vacuum-sucked and fixed to the surface of the stamp-component-holding component 1 of the stamp-component-holding portion 12. Subsequently, (12) the stamp head moving portion 11 is raised. The operation of automatically replacing the stamp component 13 can be realized in this manner. Note that the stamp component 13 can be held beforehand on the stamp component holder 20 on the stamp-component-replacement stage 19 so that the quartz glass substrate surface faces upwards.

Detachment motion of stamp component after use: in the case where a stamp replacement operation is performed from a state where a used stamp component 13 is attached to the stamp-component-holding portion 12, the stamp-head-moving portion 11 can be moved to an unshown disposal area provided separately other than the positions A, B, and C and the vacuum can be switched to OFF to detach and remove the stamp component 13. In this event, the surface of the stamp-component-holding component is further preferably subjected to wet cleaning with alcohol or the like or dry cleaning with dry air or dry nitrogen after the stamp has been detached.

When attaching the stamp component 13, the motion of bringing the stamp-component-holding portion 12 close to the stamp component 13 is further preferably performed in a two-step motion as described below:

(First Step) a rough motion of lowering the stamp-component-holding portion 12 on a large scale;

(Second Step) a high-precision moving motion of moving the stamp-head-moving portion 11 so that the surface of the stamp-component-holding component 1 is as close to the quartz glass substrate surface of the stamp component 13 as possible without contacting In this manner, unintended contact with the stamp component 13 and breakage of the stamp component 13 can be prevented, so that safety can be improved. In addition, the high-precision moving motion of the second step can be performed on the side of the stamp head moving portion 11, or can also be performed on the side of the stamp-component-replacement stage 19. Furthermore, in order to realize an approaching motion with higher accuracy, it is preferable to provide a sensor for measuring the distance between the surface of the stamp-component-holding component and the quartz glass substrate surface of the stamp component 13. For example, a capacity sensor, a laser sensor for observing proximity by the interruption state of a laser passing between the surfaces, and an image sensor, etc. can be used.

By transferring LEDs as the microstructure by using the microstructure-transfer apparatus 110 configured in the manner described above, an LED display panel can be manufactured. That is, by using the inventive microstructure-transfer apparatus to transfer desired LEDs onto a receiving substrate so that the LEDs are in pixel positions in a display and to dispose and fix the LEDs, a display panel of all pixels or a partial pixel area of the display can be manufactured. By transferring microstructures such as IC chips, one-dimensional to three-dimensional packages with compound-mounted IC and LSI, various functional devices including inorganic or organic semiconductors, electric circuit elements such as resistors, capacitors, and coils, and various microsensor elements instead of LEDs according to the method for transferring a microstructure of the present invention, a new product having a combination of these various functional devices can be manufactured.

Embodiment 7

FIG. 7 is an explanatory diagram of stamp components provided with alignment marks in a seventh embodiment of the present invention.

FIG. 7(a) shows a cross sectional view of a stamp component 13 in a first instance. FIG. 7(b) is a plan view of the stamp component 13 in the first instance seen from below. FIG. 7(c) shows a cross sectional view of a stamp component 13 in a second instance. FIG. 7(d) is a plan view of the stamp component 13 in the second instance seen from below. FIG. 7(e) shows examples of the shapes of alignment mark patterns.

In FIG. 7, "21" is a quartz glass substrate, and "22" is a silicone-based rubber film. "23" is a convex-shaped projection formed on the surface of the silicone-based rubber film, and is a stamp portion for transferring a microstructure. "25" shows a region in which the convex-shaped projections (stamp portions) 23 are laid out. "24" in FIG. 7(a) is a convex-shaped projection formed on the surface of the silicone-based rubber film 22, and is an alignment mark pattern. "26" in FIGS. 7(c) and (d) is a concave-shaped groove formed inside the silicone-based rubber film 22, and is an alignment mark pattern.

(a) and (b) of FIG. 7 show the first instance in which convex-shaped alignment marks are formed on diagonals (shown by alternate long and short dash lines). The alignment mark pattern(s) 24 is (are) formed outside the region 25 in which the convex-shaped projections 23 are laid out. When using a convex-shaped alignment mark, the height of the convex-shaped projection of the alignment mark pattern 24 is preferably made lower than the height of the convex-shaped projection in the stamp region 25. The difference between the heights needs to be larger than the distance that the convex-shaped projection 23 is pressed in from where the top of a microstructure is contacted. Note that although a circular shape is adopted for the alignment mark pattern in this instance, a rectangular or cross shape are also possible, and any shape is possible as long as the shape is a shape that an apparatus for recognizing the alignment mark can accurately read the positional information thereof.

(c) and (d) of FIG. 7 show the second instance in which alignment mark patterns 26 of concave-shaped grooves are formed on orthogonal crosslines (shown by alternate long and short dash lines). In this case too, the alignment mark patterns 26 are formed outside the region 25 in which the convex-shaped projections 23 are laid out. Note that although a square shape is adopted for the alignment mark in this instance, a circular, rectangular, or cross shape are also possible, and any shape is possible as long as the shape is a shape that an apparatus for recognizing the alignment mark can accurately read the positional information thereof.

As shown in FIG. 7(e), a circular shape 27, a square shape 28, a cross shape 29, etc. can be used as the shape of the alignment mark. The size of the alignment mark patterns 26 can be adjusted to suit the performance of the system for detecting the alignment mark patterns. For example, in the case of image recognition, recognition with sufficiently high accuracy is possible with a size of about 100 μm.

Note that the alignment mark positions do not necessarily need to be disposed on diagonals or crosslines. As long as the position coordinates of each alignment mark is known, computer processing of the transfer apparatus can deal with the situation. For absolute position, a particular position of the apparatus can be determined to determine the origin before operation. Furthermore, since alignment of the stamp component 13 in X, Y, and θ becomes possible when there are at least two, the number of alignment marks needs to be at least two places. Note that in order to raise the accuracy of alignment, the alignment marks are preferably disposed in positions as far apart as possible.

When the inventive stamp head unit having this stamp component 13 attached is mounted on the alignment mark pattern microstructure-transfer apparatus and used, it becomes possible to match the positions of the convex-shaped projections 23 and the microstructures on the donor substrate in connection with the positional information of the alignment marks of the stamp component 13 and positional recognition information of alignment marks on the donor substrate. Similarly, it becomes possible to match the positions of the stamp portion 23 and the microstructures on the receiving substrate in connection with the positional information of the alignment marks of the stamp component 13 and positional recognition information of alignment marks on the receiving substrate. In addition, when automatically replacing a stamp component 13 by using a microstructure-transfer apparatus as in FIG. 6(b), a stamp component 13 can be mounted in nearly the same part in the stamp-component-holding portion 12 (to be precise, the stamp-component-holding surface 3 of the stamp-component-holding component 1) every time by using the alignment marks.

When a stamp head unit provided with a stamp component 13 provided with alignment marks on a silicone-based rubber film 22 is used in a microstructure-transfer apparatus 110 in this manner, microstructures can be transferred with high accuracy.

As described above, a microstructure-transfer apparatus provided with high position-accuracy can be realized by mounting the inventive stamp head unit that uses the inventive stamp component with alignment marks.

As the transfer apparatus, an exclusive apparatus is the most preferable. However, an apparatus equipped with at least a donor stage, a receiving stage, a stamp head that can make a moving motion in X, Y, Z, and θ (rotational coordinates with the Z-axis as the principal axis), a stamp head unit mounted on the stamp head, a vacuum suction mechanism for vacuum-sucking a stamp component 13, an alignment-mark-recognition apparatus, and stamp-head-movement controller is sufficient. For example, it is also possible to use an apparatus which is a bonder such as a flip-chip bonder used in device mounting, and which has been improved.

Embodiment 8

FIG. 8 shows cross sectional views of stamp components 13 in an eighth embodiment of the present invention. In FIG.

8, "31" is a quartz glass substrate, and "32" and "33" are silicone-based rubber films. "34", "35", "36", and "37" are convex-shaped projections formed on a surface of the silicone-based rubber films, and are also a part of the silicone-based rubber films.

FIG. 8(a) shows a cross sectional view of a flat-plate stamp component 13. In this case, the distance between the bottom surface of the quartz glass substrate 31 and the surface of the silicone-based rubber film 32 is preferably highly-precisely constant in the plane. The precision depends on the height of the microstructure to be transferred, but is preferably at least about the height of the microstructure or less. Half the height of the microstructure or less is further preferable. For example, in the case of an LED with a size of 50 μm or less, the height is about 6 μm to 10 μm. In the case of an LED with a height of 6 μm, assuming that the pressing amount of the stamp is about twice the height of the LED, the total variation in thickness of the thickness of the quartz glass substrate 31 and the thickness of the silicone-based rubber film 32 put together (hereinafter, referred to as the variation in thickness of the entire stamp) needs to be at least 6 μm or less. When synthetic quartz glass is used for the quartz glass substrate 31, the variation in thickness of the silicone-based rubber film 32 needs to be 5 μm or less, since thickness precision of synthetic quartz glass is 1 μm or less in TTV. Therefore, the variation in thickness of the entire stamp is further preferably half the thickness of the LED (6 μm), that is, 3 μm (TTV) or less.

When a silicone-based rubber film 32 is formed flatly on a flat quartz glass substrate 31 as described, it is possible to transfer microstructures at once not only when there is one microstructure, but also when there is a plurality of 2 or more, and furthermore, when the number is ten thousand or thirty thousand.

FIG. 8(b) shows a cross sectional view of a stamp component 13 provided with one convex-shaped projection 34 on a surface of a silicone-based rubber film 33. This stamp is used when selecting any one microstructure from microstructures disposed densely on a donor substrate and performing the transfer to a desired position on a receiving substrate. It goes without saying that the stamp is used when transferring microstructures one by one. However, when the microstructures are electronic or electrical components such as LEDs, for example, the stamp can be used for repairing defective parts on a receiving substrate. One way of thinking about the adhesion face size of the convex-shaped projection 34 will be shown in the following. When the adhesion face size of the microstructure is about 100 μm or less, and furthermore, 50 μm or less in the short side, the size of the adhesion face of the convex-shaped projection 34 is preferably a size that is at least about 5% of the microstructure or more larger on one side (10% on both sides). In this manner, adhesive strength can be stably achieved. With a microstructure having an adhesion face size of about 100 μm or more in the short side, the adhesion face size of the convex-shaped projection 34 may be a little larger than the adhesion face size of the microstructure in the same manner as described above. However, transfer motion is possible even when the adhesion face size of the convex-shaped projection 34 is smaller than the adhesion face size of the microstructure.

The height of the convex-shaped projection 34 depends on the characteristics of the silicone-based rubber film, but can be about several times to about 5 times or more of the height of the microstructure. However, to be precise, the optimum size for the convex-shaped projection 34 is greatly influenced by the properties of the silicone-based rubber film and the size, shape, material, and so forth of the microstructure to be transferred. Therefore, the size should be optimized in the end by actual operation observation.

Note that although FIG. 8(b) shows an example in which the cross sectional shape of the convex-shaped projection 34 is a rectangular shape, the shape does not necessarily need to be rectangular.

FIG. 8(c) shows a cross sectional view of a stamp component 13 provided with one two-step convex-shaped projection 35 on a surface of a silicone-based rubber film. Therefore, the use thereof is the same as the case in FIG. 8(b). When a stamp provided with only one convex-shaped projection 34 is used for an actual transfer operation, sometimes, a problem arises that the life of the convex-shaped projection 34 is reduced since the pressing load of the stamp head comes on one point of the convex-shaped projection 34 in the donor substrate and the receiving substrate. For example, when the size of the microstructure is comparatively large, for example, about 100 μm or more, the convex-shaped projection 34 in FIG. 8(b) is sufficient to respond to the situation. However, when transferring a microstructure of, for example, about 100 μm or less, the shape of the convex-shaped projection is preferably a convex-shaped projection 35 with two steps as shown in FIG. 8(c). Furthermore, by making the cross sectional shape of the second step a trapezoid in this event, durability is improved when transfer motions are repeatedly employed, so that the life of the convex-shaped projection can be extended. The trapezoidal shape may be an isosceles trapezoid. It is easier to detach the convex-shaped projection when the shape is not isosceles in some cases when transferring onto a receiving substrate and detaching the convex-shaped projection.

FIG. 8(d) shows a cross sectional view of a stamp component 13 provided with a plurality of two or more convex-shaped projections 34 on a surface of a silicone-based rubber film. In this manner, a plurality of microstructures corresponding to the positions of the convex-shaped projections 34 can be transferred at once. The convex-shaped projections 34 can be designed with basically the same approach as in FIG. 8(b) regarding size. However, to be precise, the optimum size for the convex-shaped projections 34 is greatly influenced by the properties of the silicone-based rubber film and the size, shape, material, and so forth of the microstructures to be transferred. Therefore, the size should be optimized in the end by actual operation observation. When a plurality of the convex-shaped projections 34 are configured to be in a one-dimensional array or a two-dimensional array in any desired layout for the microstructures to be transferred to, and the microstructures on the donor substrate are also configured to be disposed so that the microstructures can be taken out in correspondence to the one-dimensional or two-dimensional array, a plurality of microstructures corresponding to the positions of the convex-shaped projections 34 can be transferred at once. Thus it becomes possible to transfer the microstructures in a desired layout.

When at least a part of the above-mentioned any desired layout for the microstructures to be transferred to is in a one-dimensional array or two-dimensional array having a regularity with a fixed pitch, that part can transfer a plurality of microstructures in the one-dimensional array or two-dimensional array with the fixed pitch at one time.

When the fixed pitch is configured to be an integer multiple of a pixel pitch of a display, a plurality of microstructures can be transferred to pixels separated from each other at a distance of the integer multiple. In this case, if the microstructures are LED elements, an LED display can be made.

When LEDs of R (RED), G (GREEN), and B (BLUE) are already disposed on the donor substrate side at the pixel pitch of the LED display, the LEDs can be transferred to the display panel substrate, being a receiving substrate, at once by using a stamp component 13 provided with convex-shaped projections 34 corresponding to the pixel pitch and to the disposition positions of the RGB LEDs. Note that the convex-shaped projections may be formed so as to transfer the RGB LEDs as a pixel unit with one convex surface. In this case, it is also possible to transfer the LEDs by using a stamp component 13 provided with a flat-plate silicone rubber film with no convex-shaped projections.

When transferring LEDs of one color out of red, green, and blue at a display pitch, a stamp component 13 having convex-shaped projections configured at an integer multiple of the pitch can be used to perform a transfer operation in three times from respective substrates of R-LED, G-LED, and B-LED. With a onefold pitch, transfer by certain regions of multiple pixels is possible. When convex-shaped projections are formed at an N-fold (N>=2) pitch in one direction, a pixel face of an LED display can be completed by performing the transfer while shifting the pitch (N−1) times in one direction.

When the above integer is 1, this is the pixel pitch of the display itself, and an RGB-LED display can be made by transferring at least LEDs of the three primary colors R (RED), G (GREEN), and B (BLUE) while shift the LEDs by approximately the size of the LEDs+the margin. An LED display panel can be constructed even when the integer is 2 or more, since the LEDs can be transferred on the display pixel pitch.

Note that in the case of a system in which light of RED or GREEN are produced from BLUE-LEDs by using a wavelength conversion material such as quantum dots, it is sufficient to transfer just BLUE-LEDs to positions corresponding to R, G, and B.

In addition, although FIG. 8(d) shows an example where the cross sectional shapes of the convex-shaped projections are rectangular shapes, the shapes do not necessarily need to be rectangular.

FIG. 8(e) shows a cross sectional view of a stamp component 13 provided with a plurality of two or more convex-shaped projections 36 on a surface of a silicone-based rubber film, the cross sectional shape of the convex-shaped projections 36 being trapezoids. When a cross section of the convex-shaped projection 36 is formed in a trapezoidal shape in this manner, durability of the convex-shaped projection 36 can be increased, so that the number of transfers that can be performed by one stamp component 13 can be increased. That is, the service life of one stamp can be extended. Incidentally, the trapezoidal shape may be an isosceles trapezoid. In some cases, it is easier to detach the convex-shaped projections 36 when the shape is not isosceles when transferring onto a receiving substrate and detaching the convex-shaped projections 36.

FIG. 8(f) shows a cross sectional view of a stamp component 13 provided with a plurality of two or more two-step convex-shaped projections 37 on a surface of a silicone-based rubber film. With such a configuration, it becomes possible to adhere and pick up the target chip with certainty without touching adjacent chips even when microstructures are disposed on a donor substrate at a narrower pitch. In addition, the cross sectional shape of the tip portions may be a trapezoid.

Embodiment 9

FIG. 9 shows cross sectional views of stamp components 13 for transferring multiple types of microstructures at once in a ninth embodiment of the present invention.

In FIG. 9, "41" is a quartz glass substrate, and "42" is a silicone-based rubber film. "43" to "46" are convex-shaped projections formed on surfaces of the silicone-based rubber films, and are also parts of the silicone-based rubber films.

In FIG. 9(a), the single mass of convex-shaped projection 43 formed in a central portion on the surface of the silicone-based rubber film 42 represents a stamp surface for transferring a microstructure. The convex-shaped projection 44 represents a stamp surface formed in a periphery of the silicone-based rubber film for transferring a microstructure larger than the aforementioned microstructure. With such a configuration, it becomes possible to, for example, provide elements in a state where LED elements are disposed in a central portion and LED driver elements are disposed in a periphery on the donor substrate side, and transfer both elements at one time.

In FIG. 9(b), the plurality of small convex-shaped projections 45 formed in a central portion on the surface of the silicone-based rubber film 42 represent stamp surfaces for transferring microstructures. The convex-shaped projection 46 represents a stamp surface formed in a periphery of the silicone-based rubber film for transferring a structure larger than the aforementioned microstructures. In this case too, microstructures of two different heights can be transferred at once.

Note that the surface of the convex-shaped projections to adhere to microstructures may have a rectangular, circular, elliptical, polygonal, or asymmetric shape, and for use, can be optimized to have a shape with which the adhesive strength of the silicone-based rubber film can be most efficiently exhibited with regard to the shape of the microstructures to be transferred.

When the above inventive stamp component is incorporated in the inventive stamp head unit and used, stamp component replacement can be performed extremely easily, so that downtime of the transfer apparatus can be considerably shortened. Moreover, it becomes possible to transfer microstructures efficiently by using an appropriate stamp component described in FIG. 8 and FIG. 9 depending on usage.

As stated in the description of the first embodiment, synthetic quartz glass is most preferably used for the quartz glass substrate. By using a synthetic quartz glass substrate, flatness (about 1 µm or less) of the quartz glass substrate can be achieved, so that flatness of the whole including the silicone-based rubber film can be achieved. Synthetic quartz glass is remarkably homogeneous and has a low coefficient of thermal expansion (about ⅕ or less of other quartz glass) compared with other quartz glass or glass. Therefore, a homogeneous rubber-formation treatment by heat-curing can be realized when forming a silicone-based rubber film. In addition, when actually used in a continuous transfer motion, the occurrence of positional strain of microstructures due to thermal fluctuation can be considerably suppressed. Moreover, when a silicone-based rubber film is formed by a rubber-formation treatment by UV-curing, it is possible to form a silicone-based rubber film with the least distortion, since synthetic quartz glass has a high transmittance of 90% higher in the wavelength range of 190 nm to 400 nm. In particular, when fabricating a silicone-based rubber film having a convex-shaped projection, UV-curing strain of the convex-shaped projection can be minimized.

The silicone-based rubber film and accompanying convex shape can be produced by an injection molding method, but on consideration from the viewpoint of mass-productivity, production by an imprinting method is preferable.

In addition, a silicone-based rubber film can be produced by heat-curing in either the injection molding method or the imprinting method, but in order to reduce stress strain after film formation, production by UV-curing is preferable to heat-curing.

Embodiment 10

FIG. 10 shows a configuration diagram of an antistatic stamp component in a tenth embodiment of the present invention.

FIG. 10(a) is a cross sectional view of a stamp component 13, and FIG. 10(b) is a plan view of the stamp head unit of FIG. 10(a) seen from above. In FIG. 10, "51" is a quartz glass substrate, and "53" is a silicone-based rubber film. "52" is a conductive film formed between the quartz glass substrate 51 and the silicone-based rubber film, and the conductive film covers the entire surface of the quartz glass substrate to the edges.

When one stamp repeats twenty thousand or more transfer motions in high-speed motions in an actual transfer apparatus, the stamp head unit itself causes turbulence in the apparatus, and the quartz glass substrate surface becomes liable to be electrified due to friction with the air. In particular, an electric charge is liable to be concentrated in side portions (sharp edges) or vertex portions (sharp points) of the quartz glass. A possibility arises that floating-and-electrified particles generated by turbulence adhere to the surface and end faces of the quartz glass, and become transported to and fall onto the donor substrate or receiving substrate. To prevent this, it is effective to form a conductive film 52 on the quartz glass surface so as to avoid becoming charged with electricity.

A film containing a conductive material can be used as the conductive film 52. The conductive material can be used in a state of containing at least one of a carbon-based conductive material such as carbon black, carbon filler, carbon nanowire, carbon nanotube, and graphene, salt of alkali metal or alkaline-earth metal, and ionic liquid. In this way, it becomes possible to adjust the conductivity of the conductive film at will by adjusting the amount added. Note that a plurality of the conductive materials may be used in mixture.

Examples of the salt of alkali metal or alkaline-earth metal include salts of alkali metals such as lithium, sodium, and potassium; and salts of alkaline-earth metals such as calcium and barium. Specific examples thereof include alkali metal salts such as $LiClO_4$, $LiCF_3SO_3$, $LiN(CF_3SO_2)_2$, $LiAsF_6$, LiCl, NaSCN, KSCN, NaCl, NaI, and KI; and alkaline-earth metal salts such as $Ca(ClO_4)_2$ and $Ba(ClO_4)_2$. In view of low resistivity and solubility, a lithium salt such as $LiClO_4$, $LiCF_3SO_3$, $LiN(CF_3SO_2)_2$, $LiAsF_6$, and LiCl is preferable, and $LiCF_3SO_3$ and $LiN(CF_3SO_2)_2$ are particularly preferable.

Ionic liquid is a molten salt that is liquid at room temperature (25° C.), also called room-temperature molten salt, and particularly refers to a molten salt with a melting point of 50° C. or lower. Preferably, ionic liquid refers to a molten salt with a melting point of −100 to 30° C., more preferably −50 to 20° C. Such an ionic liquid has properties such as having no vapor pressure (non-volatile), high heat resistance, non-flammable, and being chemically stable.

Examples of the ionic liquid include those containing a quaternary ammonium cation and an anion. This quaternary ammonium cation is in a form of imidazolium, pyridinium, or a cation represented by the formula: $R_4N^+$ [in the formula, each R is independently a hydrogen atom or an organic group having 1 to 20 carbon atoms].

Specific examples of the organic group represented by R include monovalent hydrocarbon groups and alkoxyalkyl groups having 1 to 20 carbon atoms, and more specific examples include alkyl groups such as a methyl, pentyl, hexyl, and heptyl group; aryl groups such as a phenyl, tolyl, xylyl, and naphthyl group; aralkyl groups such as a benzyl and phenethyl group; cycloalkyl groups such as a cyclopentyl, cyclohexyl, and cyclooctyl group; and alkoxyalkyl groups such as an ethoxyethyl group ($—CH_2CH_2OCH_2CH_3$). Note that two of the organic groups represented by R may be bonded to form a cyclic structure, and in this case, two Rs together form a divalent organic group. The main chain of this divalent organic group may be constituted with only carbon, or a heteroatom such as an oxygen atom, nitrogen atom, etc. may be contained therein. Specific examples include a divalent hydrocarbon group [for example, an alkylene group having 3 to 10 carbon atoms] and the formula: $—(CH_2)_c—O—(CH_2)_d—$ [in the formula, "c" is an integer of 1 to 5, "d" is an integer of 1 to 5, and c+d is an integer of 4 to 10].

Specific examples of the cation represented by $R_4N^+$ include methyltri-n-octylammonium cation, ethoxyethylmethylpyrrolidinium cation, and ethoxyethylmethylmorpholinium cation.

The anion is not particularly limited, but is preferably, for example, $AlCl_4^-$, $Al_3C_{18}^-$, $Al_2C_{17}^-$, $ClO_4^-$, $PF_6^-$, $BF_4^-$, $CF_3SO_3^-$, $(CF_3SO_2)_2N^-$, or $(CF_3SO_2)_3C^-$, and more preferably, $PF_6^-$, $BF_4^-$, $CF_3SO_3^-$, or $(CF_3SO_2)_2N^-$.

One of the conductive materials may be used, or two or more thereof may be used in combination.

The conductive film 52 may be configured using a conductive polymer as the conductive material. In this manner, it becomes possible to freely adjust the conductivity of the conductive film by adjusting the amount of the conductive polymer to be added. As the conductive polymer, PEDOT/PSS which is polythiophene-based, polyaniline sulfonic acid which is polyaniline-based, and the like can be used. Note that the conductive polymer is not limited to those described above, and other conductive polymers may be used. In addition, a combination of a conductive polymer and at least one of a carbon-based conductive material, salt of alkali metal, salt of alkaline-earth metal, and ionic liquid may also be used.

The conductive film 52 may be constituted of a conductive silicone-based rubber film. The conductive silicone-based rubber film may contain the conductive material.

A conductive film having a higher conductivity than the silicone-based rubber film is preferably formed on the entire surface of the quartz glass substrate, and is formed between the quartz glass substrate and the silicone-based rubber film so as to cover the whole surface of the quartz glass substrate. In this manner, the entire surface of the stamp becomes conductive even when the silicone-based rubber film is smaller than the surface area of the quartz glass substrate. In addition, even when the surface areas of the silicone-based rubber film and the quartz glass substrate are the same, it is possible to prevent, by there being a conductive film with a higher conductivity than the silicone-based rubber film, electrification on the quartz glass surface end portions where electric charge is particularly liable to be concentrated. Thus, adhesion of electrified particles floating near the stamp component to the stamp component 13 can be reduced.

The surface resistivity of the conductive film 52 can be a sheet resistance of 1E9 to 1E14 Ω/sq. at which an antistatic effect can be exhibited. A sheet resistance of 1E5 to 1E9 Ω/sq. at which an electrostatic diffusion (dissipation) effect can be exhibited is preferable. 1E5 Ω/sq. or lower, at which conductivity is exhibited is further preferable.

FIG. 11 shows a different configuration diagram of an antistatic stamp component in the tenth embodiment of the present invention.

FIG. 11(a) is a cross sectional view of a stamp component 13, and FIG. 11(b) is a plan view of the stamp head unit of FIG. 11(a) seen from above. The only difference between FIG. 11 and FIG. 10 is that convex-shaped projections 55 are formed on a silicone-based rubber film 54. As the shape of the convex shapes, shapes such as those described in FIG. 8 and FIG. 9 can be adopted, and the shape can be optimized according to the shape and size of the microstructure to be transferred.

Embodiment 11

FIG. 12 shows a cross sectional view of an antistatic stamp component in an eleventh embodiment of the present invention.

In FIG. 12, "51" is a quartz glass substrate, and "56" is a conductive silicone-based rubber film.

FIG. 12(a) has a structure in which a conductive silicone-based rubber film 56 is formed on a quartz glass substrate 51. When the silicone-based rubber film itself is thus imparted with conductivity, and is configured to have an antistatic effect, an electrostatic diffusion (dissipation) effect, or conductivity, it is possible to prevent the adhesion of floating-and-electrified particles to the silicone-based rubber film of a stamp portion.

FIG. 12(b) shows a stamp component 13 in which the conductive silicone-based rubber film 56 covers the entire surface of the quartz glass substrate including the periphery of the quartz glass substrate 51 that is not covered with the conductive silicone-based rubber film 56 in FIG. 12(a). In this manner, the adhesion of floating-and-electrified particles to the entire stamp component surface can be prevented since no part of the quartz glass is exposed.

FIG. 12(c) shows a stamp component 13 in which the entire surface of the quartz glass substrate 51 is covered with a conductive film 52, and a slightly smaller conductive silicone-based rubber film 56 is further formed thereon. In such a configuration too, the adhesion of floating-and-electrified particles to the entire stamp component surface can be prevented since no part of the quartz glass is exposed.

A film containing a conductive material can be used as the conductive silicone-based rubber film 56. The conductive material contained in the conductive silicone-based rubber film 56 can be used in a state of containing at least one of a carbon-based conductive material such as carbon black, carbon filler, carbon nanowire, carbon nanowire, carbon nanotube, and graphene, salt of alkali metal or alkaline-earth metal, and ionic liquid. In this way, it becomes possible to adjust the conductivity of the conductive silicone-based rubber film 56 at will by adjusting the amount added. Note that a plurality of the conductive materials may be used in mixture.

The salt of alkali metal, salt of alkaline-earth metal, and ionic liquid are as described above.

A conductive polymer may be used as the conductive material contained in the conductive silicone-based rubber film 56. In this manner, it becomes possible to freely adjust the conductivity of the conductive silicone-based rubber film by adjusting the amount of the conductive polymer to be added. As the conductive polymer, PEDOT/PSS which is polythiophene-based, polyaniline sulfonic acid which is polyaniline-based, and the like can be used. Note that the conductive polymer is not limited to those described above, and other conductive polymers may be used. In addition, a combination of a conductive polymer and at least one of a carbon-based conductive material, salt of alkali metal, salt of alkaline-earth metal, and ionic liquid may also be used.

The surface resistivity of the conductive silicone-based rubber film 56 can be a sheet resistance of 1E9 to 1E14 Ω/sq. at which an antistatic effect can be exhibited. A sheet resistance of 1E5 to 1E9 Ω/sq. at which an electrostatic diffusion (dissipation) effect can be exhibited is preferable. 1E5 Ω/sq. or lower, at which conductivity is exhibited is further preferable.

FIG. 13 shows a different cross sectional view of an antistatic stamp component in the eleventh embodiment of the present invention.

The only difference between FIG. 13 and FIG. 12 is that convex-shaped projections 58 are formed on a conductive silicone-based rubber film 57. Note that as the shape of the convex shapes, shapes such as those described in FIG. 8 and FIG. 9 can be adopted, and the shape can be optimized according to the shape and size of the microstructure to be transferred.

Note that the object to be transferred by the inventive microstructure-transfer apparatus includes, but is not limited to microstructures such as organic or inorganic LEDs, semiconductor lasers, IC chips, one-dimensional to three-dimensional packages with compound-mounted IC and LSI, various functional devices including inorganic or organic semiconductors, electric circuit elements such as resistors, capacitors, and coils, various microsensor elements, various functional devices of MEMS (microelectromechanical system), and sensors. By transferring these microstructures according to the method for transferring a microstructure of the present invention, it is possible to manufacture a new functional product having a combination of these various functional devices, that is, a microstructure-integrated product.

The present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A stamp head unit comprising:
 a stamp component comprising at least a silicone-based rubber film on a quartz glass substrate;
 a stamp-component-holding component comprising a surface having a hole for vacuum suction of a surface of the quartz glass substrate of the stamp component; and
 a tubular component having an evacuation suction hole connected to communicate with the hole for vacuum suction so as to maintain a vacuum, and being coupled and fixed with the stamp-component-holding component,
 wherein the quartz glass substrate does not include through holes in a stamp area.

2. The stamp head unit according to claim 1, wherein the hole of the stamp-component-holding component for vacuum suction is divided into a plurality of parts to fix the quartz glass substrate by suction in a plurality of points.

3. The stamp head unit according to claim 1, wherein a groove structure is formed on the surface of the stamp-component-holding component to which the stamp component is attached, the groove structure being connected to the evacuation suction hole via the hole for vacuum suction.

4. The stamp head unit according to claim 1, wherein the quartz glass substrate is a flat rectangular plate.

5. The stamp head unit according to claim 1, wherein a facet is formed in the quartz glass substrate.

6. The stamp head unit according to claim 1, wherein the tubular component has a collet connector portion.

7. The stamp head unit according to claim 1, wherein the surface of the stamp-component-holding component for holding the stamp component comprises a convex structure for adjusting a position of the stamp component.

8. The stamp head unit according to claim 7, wherein the convex structure has an orthogonal side surface.

9. The stamp head unit according to claim 1, wherein the silicone-based rubber film of the stamp component has an alignment mark.

10. The stamp head unit according to claim 1, wherein the quartz glass substrate is synthetic quartz glass.

11. A microstructure-transfer apparatus comprising the stamp head unit according to claim 1.

12. The microstructure-transfer apparatus according to claim 11, comprising a mechanism for adjusting a position of a stamp surface in X-Y orthogonal coordinates, a position in a Z-coordinate that is orthogonal to an X-Y plane, and rotation angle θ with a Z-axis as a center, of the stamp component mounted on the stamp head unit.

13. The microstructure-transfer apparatus according to claim 11, comprising a unit for replacing the stamp component.

14. A method for transferring a microstructure-integrated component, the method comprising:
transferring a microstructure by using the microstructure-transfer apparatus according to claim 11.

15. A stamp component for transferring a microstructure, the stamp component having at least one layer of a silicone-based rubber film formed on a synthetic quartz glass substrate,
wherein the quartz glass substrate does not include through holes in a stamp area.

16. The stamp component for transferring a microstructure according to claim 15, wherein the synthetic quartz glass substrate has a thickness of 0.5 mm to 7 mm.

17. The stamp component for transferring a microstructure according to claim 15, wherein there is a difference of 18 μm or less between a maximum and minimum film thickness of a silicone-based rubber of the silicone-based rubber film in a face portion that adheres to the microstructure.

18. The stamp component for transferring a microstructure according to claim 15, comprising a conductive film between the synthetic quartz glass substrate and the silicone-based rubber film.

19. The stamp component for transferring a microstructure according to claim 18, wherein the conductive film is formed to cover an entire surface of the synthetic quartz glass substrate.

20. The stamp component for transferring a microstructure according to claim 18, wherein the conductive film contains a conductive material.

21. The stamp component for transferring a microstructure according to claim 20, wherein the conductive material is at least one of carbon black, carbon filler, carbon nanowire, carbon nanotube, graphene, salt of alkali metal or alkaline-earth metal, and ionic liquid.

22. The stamp component for transferring a microstructure according to claim 20, wherein the conductive material contains at least a conductive polymer.

23. The stamp component for transferring a microstructure according to claim 18, wherein the conductive film is a conductive silicone-based rubber film.

24. The stamp component for transferring a microstructure according to claim 15, wherein the silicone-based rubber film is a conductive silicone-based rubber film.

25. The stamp component for transferring a microstructure according to claim 23, wherein the conductive silicone-based rubber film contains a conductive material.

26. The stamp component for transferring a microstructure according to claim 25, wherein the conductive material contained in the conductive silicone-based rubber film is at least one of carbon black, carbon filler, carbon nanowire, carbon nanotube, graphene, salt of alkali metal or alkaline-earth metal, and ionic liquid.

27. The stamp component for transferring a microstructure according to claim 25, wherein the conductive material contained in the conductive silicone-based rubber film contains at least a conductive polymer.

28. The stamp component for transferring a microstructure according to claim 15, comprising one convex-shaped projection on a surface of the silicone-based rubber film.

29. The stamp component for transferring a microstructure according to claim 15, comprising two or more convex-shaped projections on a surface of the silicone-based rubber film.

30. The stamp component for transferring a microstructure according to claim 29, wherein the two or more convex-shaped projections include convex-shaped projections having two or more different heights.

31. The stamp component for transferring a microstructure according to claim 29, wherein the two or more convex-shaped projections have a face portion that is to be contacted with a microstructure, and comprise convex-shaped projections whose face portions have two or more different areas.

32. The stamp component for transferring a microstructure according to claim 29, wherein the two or more convex-shaped projections are optionally in a one-dimensional array or a two-dimensional array.

33. The stamp component for transferring a microstructure according to claim 32, wherein the one-dimensional array or two-dimensional array includes a portion having a regularity with a fixed pitch.

34. The stamp component for transferring a microstructure according to claim 33, wherein the fixed pitch is an integer multiple of a pixel pitch of a display.

35. The stamp component for transferring a microstructure according to claim 28, wherein a cross sectional shape of the convex-shaped projection is a trapezoidal shape.

36. The stamp component for transferring a microstructure according to claim 35, wherein the cross sectional shape of the convex-shaped projection comprises a portion that is a trapezoidal shape that is smaller in a tip side.

37. The stamp component for transferring a microstructure according to claim 28, wherein a cross sectional shape of the convex-shaped projection is a stepped convex shape with two or more steps.

38. A stamp head unit for transferring a microstructure, the stamp head unit comprising the stamp component for transferring a microstructure according to claim 15.

39. A microstructure-transfer apparatus comprising the stamp head unit according to claim 38.

40. A method for transferring a microstructure-integrated component, the method comprising:
 transferring a microstructure by using the microstructure-transfer apparatus according to claim 39.

41. The stamp component for transferring a microstructure according to claim 28, wherein:
 the convex-shaped projection projects in a projection direction and includes a first section and a second section,
 the first section of the convex-shaped projection is positioned between the silicone-based rubber film and the second section of the convex-shaped projection along the projection direction, and
 an angle of inclination on a side surface of the first section of the convex-shaped projection is different from an angle of inclination on a side surface of the second section of the convex-shaped projection.

42. The stamp component for transferring a microstructure according to claim 41, wherein a cross-sectional shape of the first section and the second section is a trapezoid.

\* \* \* \* \*